US010468091B2

(12) United States Patent
Lee

(10) Patent No.: US 10,468,091 B2
(45) Date of Patent: Nov. 5, 2019

(54) SEMICONDUCTOR MEMORY DEVICE AND METHOD FOR OPERATING THE SAME

(71) Applicant: SK hynix Inc., Gyeonggi-do (KR)

(72) Inventor: Joo Young Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/139,573

(22) Filed: Sep. 24, 2018

(65) Prior Publication Data

US 2019/0267073 A1    Aug. 29, 2019

(30) Foreign Application Priority Data

Feb. 26, 2018    (KR) .................. 10-2018-0023146

(51) Int. Cl.
| G11C 11/408 | (2006.01) |
| G06F 12/0871 | (2016.01) |
| G06F 12/0882 | (2016.01) |
| G11C 11/4097 | (2006.01) |
| G11C 11/4099 | (2006.01) |
| G11C 7/10 | (2006.01) |

(52) U.S. Cl.
CPC ...... G11C 11/4082 (2013.01); G06F 12/0871 (2013.01); G06F 12/0882 (2013.01); G11C 7/1063 (2013.01); G11C 11/4085 (2013.01); G11C 11/4087 (2013.01); G11C 11/4097 (2013.01); G11C 11/4099 (2013.01)

(58) Field of Classification Search
CPC ............ G11C 11/4082; G11C 11/4085; G11C 11/4097
USPC .................... 365/219, 221, 230.08
See application file for complete search history.

(56) References Cited

U.S. PATENT DOCUMENTS

| 2009/0021999 A1* | 1/2009 | Tanimura ............... G11C 7/222 |
| | | 365/200 |
| 2010/0164094 A1* | 7/2010 | Chung ..................... G11C 5/04 |
| | | 257/723 |

FOREIGN PATENT DOCUMENTS

| KR | 1020120129895 | 11/2012 |
| KR | 101668340 | 10/2016 |

* cited by examiner

Primary Examiner — Han Yang
(74) Attorney, Agent, or Firm — IP & T GROUP LLP

(57) ABSTRACT

The semiconductor memory device includes a memory cell array, a page buffer, a cache buffer, and a control logic. The memory cell array includes a plurality of memory blocks. The page buffer senses data of a selected page of the memory cell array. The cache buffer temporarily stores the data sensed by the page buffer. The control logic controls operations of the page buffer and the cache buffer to read data stored in the memory cell array. The control logic controls operations of the page buffer and the cache buffer, based on a cache-normal state of the semiconductor memory device.

20 Claims, 16 Drawing Sheets

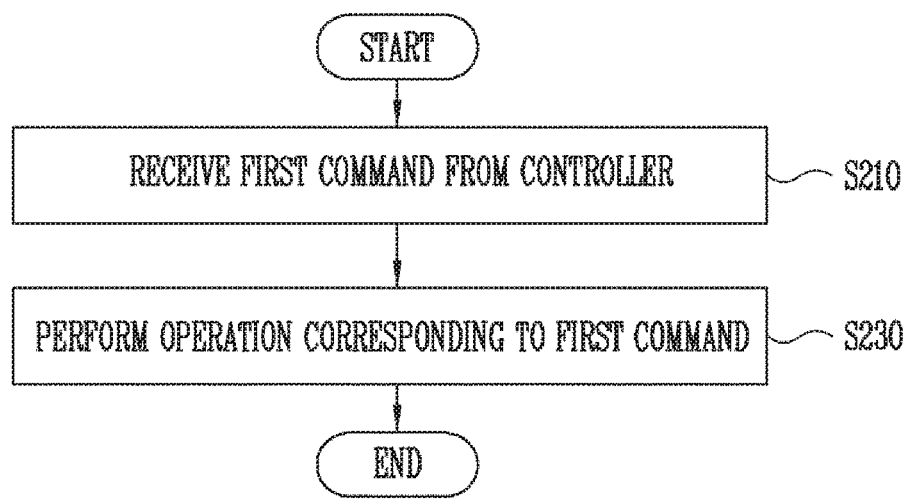
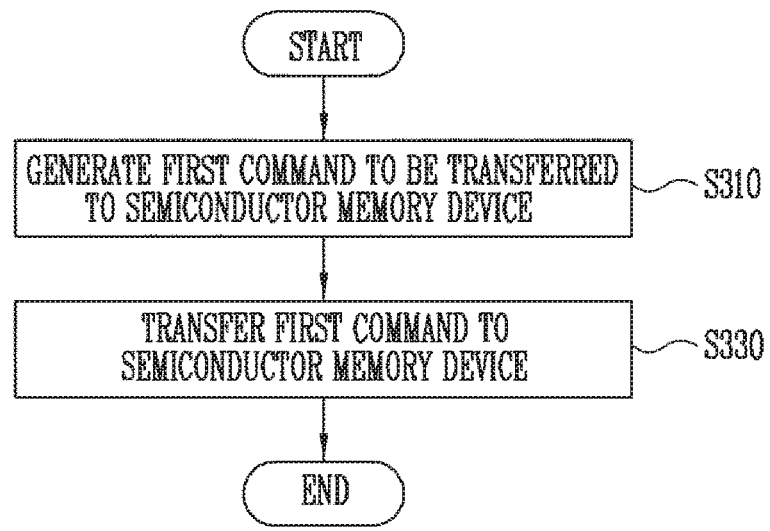

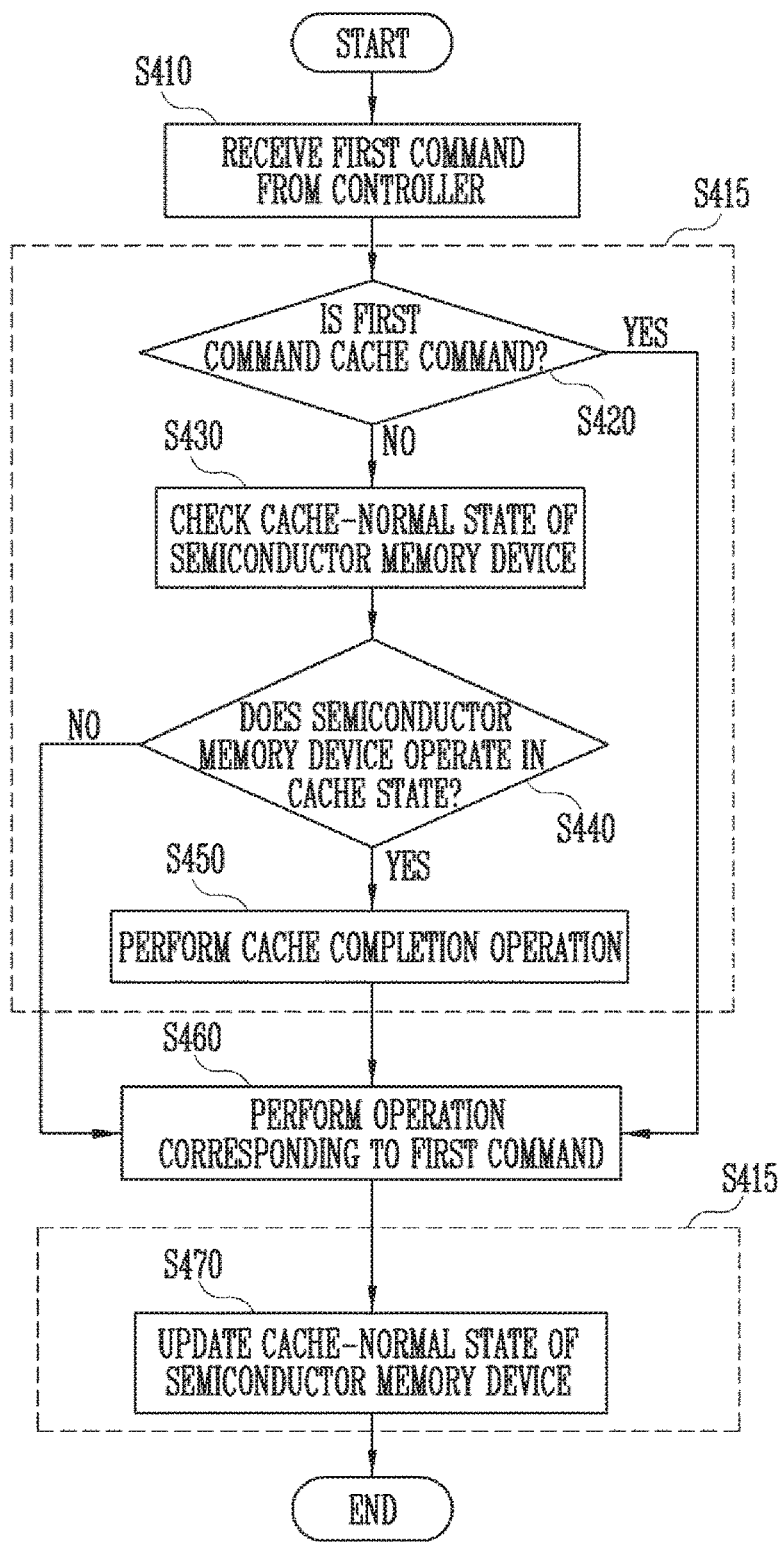

SEMICONDUCTOR MEMORY DEVICE AND METHOD FOR OPERATING THE SAME

CROSS-REFERENCE TO RELATED APPLICATION

The present application claims priority under 35 U.S.C. § 119(a) to Korean patent application number 10-2018-0023146, filed on Feb. 26, 2018, the entire disclosure of which is incorporated herein by reference in its entirety.

BACKGROUND

1. Field of Invention

Various embodiments of the present disclosure generally relate to an electronic device. Particularly, the embodiments relate to a semiconductor memory device and a method for operating the same.

2. Description of Related Art

Memory devices may be formed in a two-dimensional structure in which strings are arranged horizontally, or be formed in a three-dimensional structure in which strings are arranged vertically. A three-dimensional semiconductor device is a memory device devised in order to overcome the limit of degree of integration in two-dimensional semiconductor devices, and may include a plurality of memory cells vertically stacked on a semiconductor substrate.

SUMMARY

Embodiments provide a semiconductor memory device capable of efficiently managing a cache-normal state.

Embodiments also provide a method for operating a semiconductor memory device capable of efficiently managing a cache-normal state.

According to an aspect of the present disclosure, there is provided a semiconductor memory device including: a memory cell array including a plurality of memory blocks; a page buffer configured to sense data of a selected page of the memory cell array; a cache buffer configured to temporarily store the data sensed by the page buffer; and a control logic configured to control operations of the page buffer and the cache buffer to read data stored in the memory cell array, wherein the control logic controls operations of the page buffer and the cache buffer, based on a cache-normal state of the semiconductor memory device.

When a normal command is received while the cache-normal state of the semiconductor memory device is a cache state, the control logic may control the page buffer and the cache buffer to perform a cache completion operation, and control the page buffer and the cache buffer to perform an operation corresponding to the normal command after the cache completion operation is performed.

The control logic may switch the cache-normal state of the semiconductor memory device from the cache state to a normal state after the cache completion operation is performed.

When a cache command is received while the cache-normal state of the semiconductor memory device is a normal state, the control logic may switch the cache-normal state of the semiconductor memory device from the normal state to the cache state, and control the page buffer and the cache buffer to perform an operation corresponding to the received cache command.

The control logic may include a cache state processor configured to manage the cache-normal state of the semiconductor memory device. The cache state processor may control the page buffer and the cache buffer to perform the cache completion operation, based on the cache-normal state of the semiconductor memory device and the type of a received command.

The cache state processor may include: a command storing section configured to store a command received by the semiconductor memory device; a cache-normal state storing section configured to store the cache-normal state of the semiconductor memory device; and a command operation control section configured to control operations of the page buffer and the cache buffer, based on the command and the cache-normal state.

When the command stored in the command storing section is a normal command, and the cache-normal state stored in the cache-normal state storing section is a cache state, the command operation control section may control the page buffer and the cache buffer to perform the cache completion operation before an operation corresponding to the normal command is performed.

The command operation control section may control the page buffer and the cache buffer to perform an operation corresponding to the normal command after the cache completion operation is performed.

The command operation control section may update the cache-normal state stored in the cache-normal state storing section to a normal state after the cache completion operation is performed.

When the command stored in the command storing section is a cache command, and the cache-normal state stored in the cache-normal state storing section is a normal state, the command operation control section may update the cache-normal state stored in the cache-normal state storing section to a cache state, and control the page buffer and the cache buffer to perform an operation corresponding to the cache command.

According to another aspect of the present disclosure, there is provided a method for operating a semiconductor memory device, the method including: receiving a first command from a controller; and controlling operations of a page buffer and a cache buffer, based on a cache-normal state of the semiconductor memory device and the type of the first command.

When the first command is a normal command, and the cache-normal state is a cache state, the controlling of the operations of the page buffer and the cache buffer, based on the cache-normal state of the semiconductor memory device and the type of the first command, may include: performing a cache completion operation; and performing an operation corresponding to the first command.

The method may further include updating the cache-normal state from the cache state to a normal state after the cache completion operation is performed.

When the first command is a cache command, and the cache-normal state is a normal state, the controlling of the operations of the page buffer and the cache buffer, based on the cache-normal state of the semiconductor memory device and the type of the first command, may include: performing an operation corresponding to the first command; and updating the cache-normal state from the normal state to a cache state.

According to another aspect of the present disclosure, there is provided a semiconductor memory device including: a memory cell array; a peripheral circuit configured to perform a read operation on the memory cell array in a state among cache and normal states, and including page and cache buffers configured to sequentially buffer data read out from the memory cell array in a pipelining manner in the cache state; and a control logic configured to reset, in response to a read command for reading data in the normal state, the page and cache buffers working in the cache state and then controlling the peripheral circuit to perform the read operation on the memory cell array in the normal state.

When a read command for reading data in the normal state is received while the state of the semiconductor memory device is a cache state, the control logic may control the page buffer and the cache buffer to perform a cache completion operation, and control the page buffer and the cache buffer to perform an operation corresponding to the normal command after the cache completion operation is performed.

The control logic may include a cache state processor configured to manage the state, among the cache and normal states, of the semiconductor memory device. The cache state processor controls the page buffer and the cache buffer to perform the cache completion operation, based on the state, among the cache and normal states, of the semiconductor memory device and the type of a received command.

The cache state processor may include: a command storing section configured to store a command received by the semiconductor memory device; a cache-normal state storing section configured to store the state, among the cache and normal states, of the semiconductor memory device; and a command operation control section configured to control operations of the page buffer and the cache buffer, based on the command and the state.

When the command stored in the command storing section is a normal command, and the state, among the cache and normal states, stored in the cache-normal state storing section is a cache state, the command operation control section may control the page buffer and the cache buffer to perform the cache completion operation before an operation corresponding to the normal command is performed.

The command operation control section may control the page buffer and the cache buffer to perform an operation corresponding to the normal command after the cache completion operation is performed.

The command operation control section may update the state, among the cache and normal states, stored in the cache-normal state storing section to a normal state after the cache completion operation is performed.

BRIEF DESCRIPTION OF THE DRAWINGS

Various embodiments will now be described in more detail hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art. It is noted that reference to "an embodiment" does not necessarily mean only one embodiment, and different references to "an embodiment" are not necessarily to the same embodiment(s).

In the drawings, dimensions of the figures may be exaggerated for clarity of illustration. It will be understood that when an element is referred to as being "between" two elements, it can be the only element between the two elements, or one or more intervening elements may also be present. Like reference numerals refer to like elements throughout.

FIG. 11 is a flowchart illustrating an operation of the semiconductor memory device coupled to the controller according to FIG. 10.

FIG. 12 is a flowchart illustrating an operating method of the controller that controls the semiconductor memory device that manages the cache-normal state according to an embodiment of the present disclosure.

FIG. 13 is a flowchart illustrating an operating method of the semiconductor memory device that manages the cache-normal state according to an embodiment of the present disclosure.

DETAILED DESCRIPTION

Figure 1:
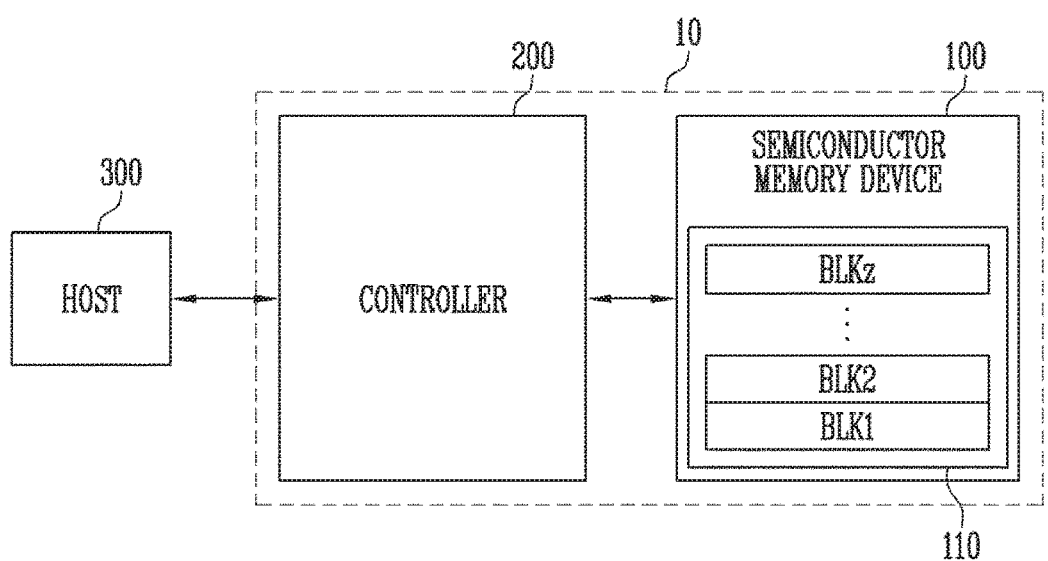
FIG. 1 is a block diagram illustrating a storage device.

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

The terminology used herein is for the purpose of describing particular embodiments only and is not intended to be limiting of the present invention.

As used herein, singular forms may include the plural forms as well and vice versa, unless the context clearly indicates otherwise.

Hereinafter, exemplary embodiments of the present disclosure will be described in detail with reference to the accompanying drawings. The same reference numerals are used to designate the same elements as those shown in other drawings. In the following descriptions, only portions necessary for understanding operations according to the exemplary embodiments may be described, and descriptions of the other portions may be omitted so as to not obscure important concepts of the embodiments.

FIG. 1 is a block diagram illustrating a storage device.

Referring to FIG. 1, the storage device 10 may include a semiconductor memory device 100 and a controller 200. Also, the storage device 10 communicates with a host 300. The semiconductor memory device 100 may include a memory cell array 110, and the memory cell array 110 may include a plurality of memory blocks BLK1, BLK2, . . . , and BLKz. The controller 200 controls the overall operations of the semiconductor memory device 100. Also, the controller 200 controls the semiconductor memory device 100 in response to a command received from the host 300.

Figure 2:
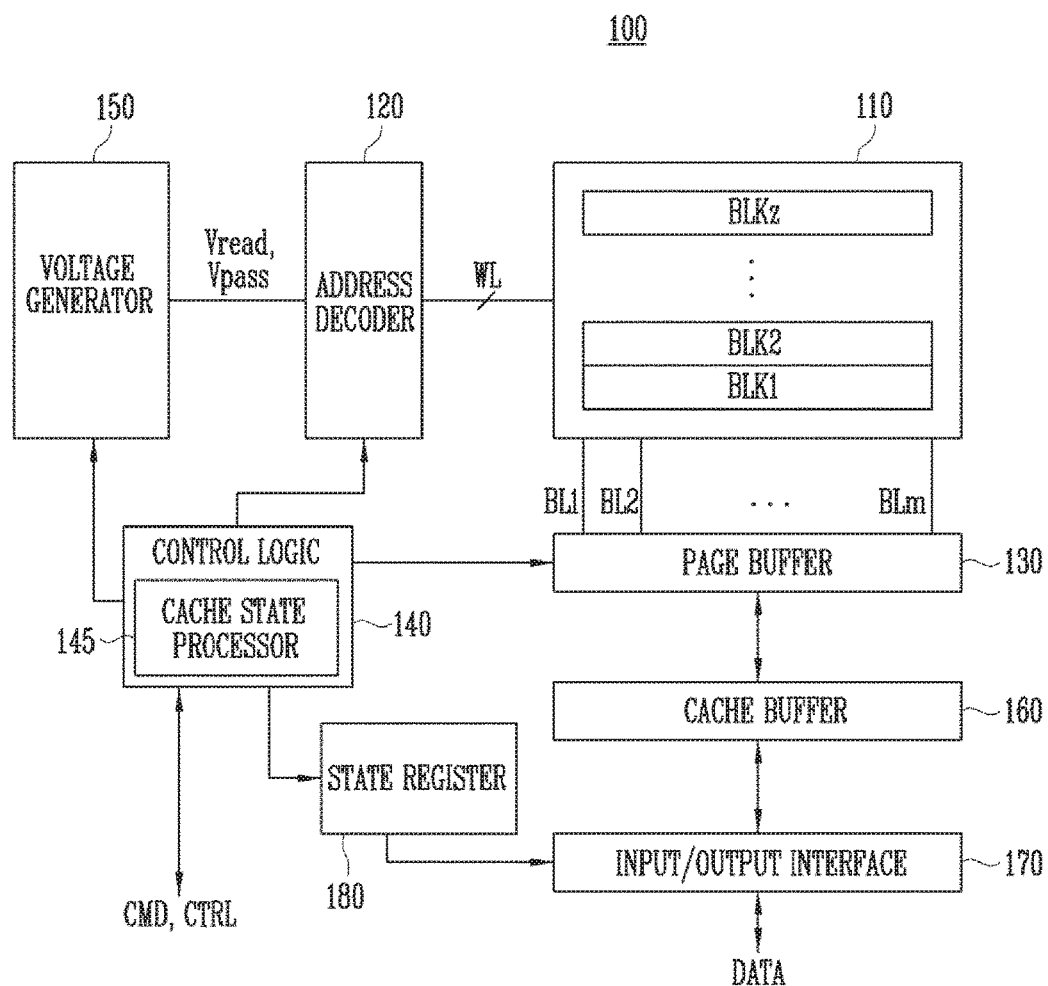
FIG. 2 is a block diagram illustrating a semiconductor memory device according to an embodiment of the present disclosure.

FIG. 2 is a block diagram illustrating a semiconductor memory device according to an embodiment of the present disclosure.

Referring to FIG. 2, the semiconductor memory device 100 may include a memory cell array 110, an address decoder 120, a page buffer 130, a control logic 140. A voltage generator 150, a cache buffer 160, an input/output interface 170, and a state register 180.

The memory cell array 110 may include a plurality of memory blocks BLK1 to BLKz. The plurality of memory blocks BLK1 to BLKz are coupled to the address decoder 120 through word lines WL. The plurality of memory blocks BLK1 to BLKz are coupled to the read/write circuit 130 through bit lines BL1 to BLm. Each of the plurality of memory blocks BLK1 to BLKz may include a plurality of memory cells. In an embodiment, the plurality of memory cells are nonvolatile memory cells, and may be configured as nonvolatile memory cells having a vertical channel structure. The memory cell array 110 may be configured as a memory cell array having a two-dimensional structure. In some embodiments, the memory cell array 110 may be configured as a memory cell array having a three-dimensional structure. Meanwhile, each of the plurality of memory cells included in the memory cell array 110 may store data of at least one bit. In an embodiment, each of the plurality of memory cells included in the memory cell array 110 may be a single-level cell (SLC) that stores data of one bit. In another embodiment, each of the plurality of memory cells included in the memory cell array 110 may be a multi-level cell (MLC) that stores data of two bits. In still another embodiment, each of the plurality of memory cells included in the memory cell array 110 may be a triple-level cell (TLC) that stores data of three bits. In still another embodiment, each of the plurality of memory cells included in the memory cell array 110 may be a quad-level cell (QLC) that stores data of four bits. In some embodiments, the memory cell array 110 may include a plurality of memory cells that each stores data of five or more bits.

The address decoder 120, the page buffer 130, the voltage generator 150, the cache buffer 160, and the input/output interface 170 operate as a peripheral circuit for driving the memory cell array 110. The address decoder 120 is coupled to the memory cell array 110 through the word lines WL. The address decoder 120 is configured to operate in response to the control of the control logic 140. The address decoder 120 receives an address through an input/output buffer (not shown) provided in the semiconductor memory device 100.

The address decoder 120 is configured to decode a block address in the received address. The address decoder 120 selects at least one memory block according to the decoded block address. In a read voltage application operation during a read operation, the address decoder 120 applies a read voltage Vread generated by the voltage generator 150 to a selected word line in the selected memory block, and applies a pass voltage Vpass to the other unselected word lines. In a program verify operation, the address decoder 120 applies a verify voltage generated by the voltage generator 150 to the selected word line in the selected memory block, and applies the pass voltage Vpass to the other unselected word lines. The address decoder 120 is configured to decode a column address in the received address.

Read and program operations of the semiconductor memory device 100 are performed in units of pages. An address received in a request of the read operation and the program operation may include a block address, a row address, and a column address. The address decoder 120 selects one memory block and one word line according to the block address and the row address. The address decoder 120 may include a block decoder, a row decoder, a column decoder, an address buffer, and the like.

The page buffer 130 is coupled to the memory cell array 110 through the bit lines BL1 to BLm. In order to sense threshold voltages of memory cells in the read operation and the program verify operation, the page buffer 130 senses a change in amount of current flowing depending on a program state of a corresponding memory cell while continuously supplying sensing current to bit lines coupled to the memory cells, and latches the sensed change as sensing data. The page buffer 130 operates in response to page buffer control signals output from the control logic 140.

In the read operation, the page buffer 130 temporarily stores read data by sensing data of a memory cell. Meanwhile, the data temporarily stored in the page buffer 130 may be output to the controller 200 through the cache buffer 160 and the input/output interface 170.

The control logic 140 is coupled to the address decoder 120, the page buffer 130, and the voltage generator 150. Also, the control logic 140 may control operations of the cache buffer 160 and the input/output interface 170. Also, the control logic 140 may be coupled to the state register 180.

The control logic 140 receives a command CMD and a control signal CTRL from the controller 200. In FIG. 2, the semiconductor memory device 100 is configured such that the command CMD and the control signal CTRL do not pass through the input/output interface 170 but are transferred to the control logic 140. However, the semiconductor memory device 100 is not limited thereto, and the command CMD and the control signal CTRL may be transferred to the control logic 140 through the input/output interface 170. The control logic 140 controls the overall operations of the semiconductor memory device 100 in response to the control signal CTRL. Also, the control logic 140 may control the page buffer 130 and the cache buffer 160 to perform a read operation and a write operation of the memory cell array 110.

The control logic 140 of the semiconductor memory device 100 according to the embodiment of the present disclosure may include a cache state processor 145. The cache state processor 145 determines whether the semiconductor memory device 100 currently operates in a cache state or operates in a normal state, and controls the overall operations of the semiconductor memory device 100, based on the determination result. A cache-normal state of the semiconductor memory device 100 may be any one of the cache state and the normal state. More specifically, when the command CMD received from the controller 200 is a normal command, and a current cache-normal state of the semiconductor memory device 100 is the cache state, the cache state processor 145 controls an operation of the peripheral circuit to perform a cache completion operation of the semiconductor memory device 100 and then perform an operation corresponding to the received normal command. Thus, the cache-normal state of the semiconductor memory device 100 is internally processed in the semiconductor memory device 100, and the semiconductor memory device 100 autonomously determines whether the cache completion operation is to be performed. Accordingly, it is unnecessary for the controller 200 to monitor the cache-normal state of the semiconductor memory device 100. Consequently, the configuration of the controller 200 is further simplified.

Processing of the cache state in the semiconductor memory device 100 according to the embodiment of the present disclosure will be described later with reference to FIGS. 7 to 14.

In the read operation, the voltage generator 150 generates the read voltage Vread and the pass voltage Vpass in response to a control signal output from the control logic 140. In order to generate a plurality of voltages having various voltage levels, the voltage generator 150 may include a plurality of pumping capacitors for receiving an internal power voltage, and generate a plurality of voltages by selectively activating the plurality of pumping capacitors under the control of the control logic 140.

The state register 180 may store a value representing a current state of the semiconductor memory device 100. For example, the state register 180 may store data representing a busy state while the semiconductor memory device 100 is performing a specific operation. Meanwhile, the state register 180 may store data representing a ready state while the semiconductor memory device 100 is not performing any operation. The data stored in the state register 180 may be transferred to the controller 200. In an example, as shown in FIG. 2, the data stored in the state register 180 may be transferred to the controller 200 through the input/output interface 170. In another example, the data stored in the state register 180 does not pass through the input/output interface 170 but may be transferred to the controller 200 through a separate data path. The controller 200 determines whether the semiconductor memory device 100 currently performs an operation, based on the data stored in the state register 180, and thus can appropriately control the operation of the semiconductor memory device 100.

Figure 3:
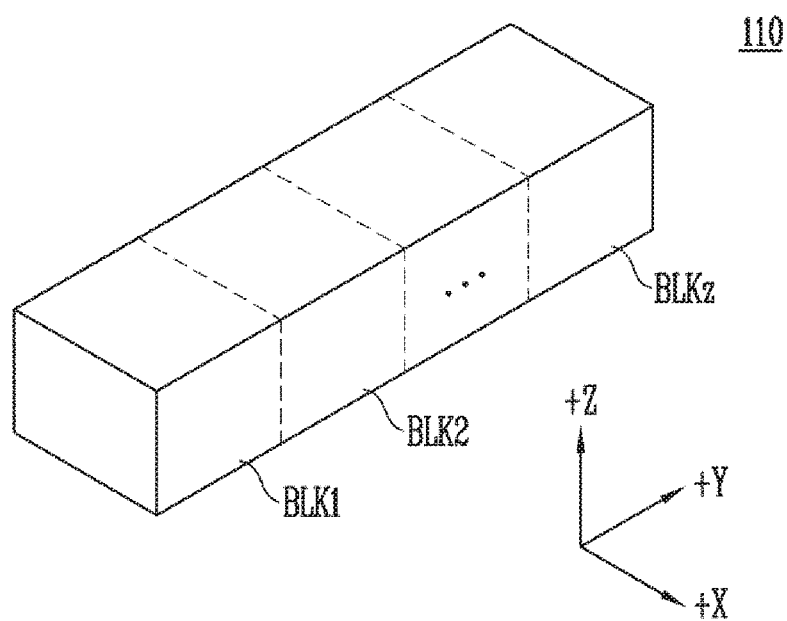
FIG. 3 is a diagram illustrating an embodiment of a memory cell array of FIG. 2.

FIG. 3 is a diagram illustrating an embodiment of the memory cell array of FIG. 2.

Referring to FIG. 3, the memory cell array 110 may include a plurality of memory blocks BLK1 to BLKz. Each memory block has a three-dimensional structure. Each memory block may include a plurality of memory cells stacked above a substrate. The plurality of memory cells are arranged along +X, +Y, and +Z directions. The structure of each memory block will be described in more detail with reference to FIGS. 4 and 5.

Figure 4:
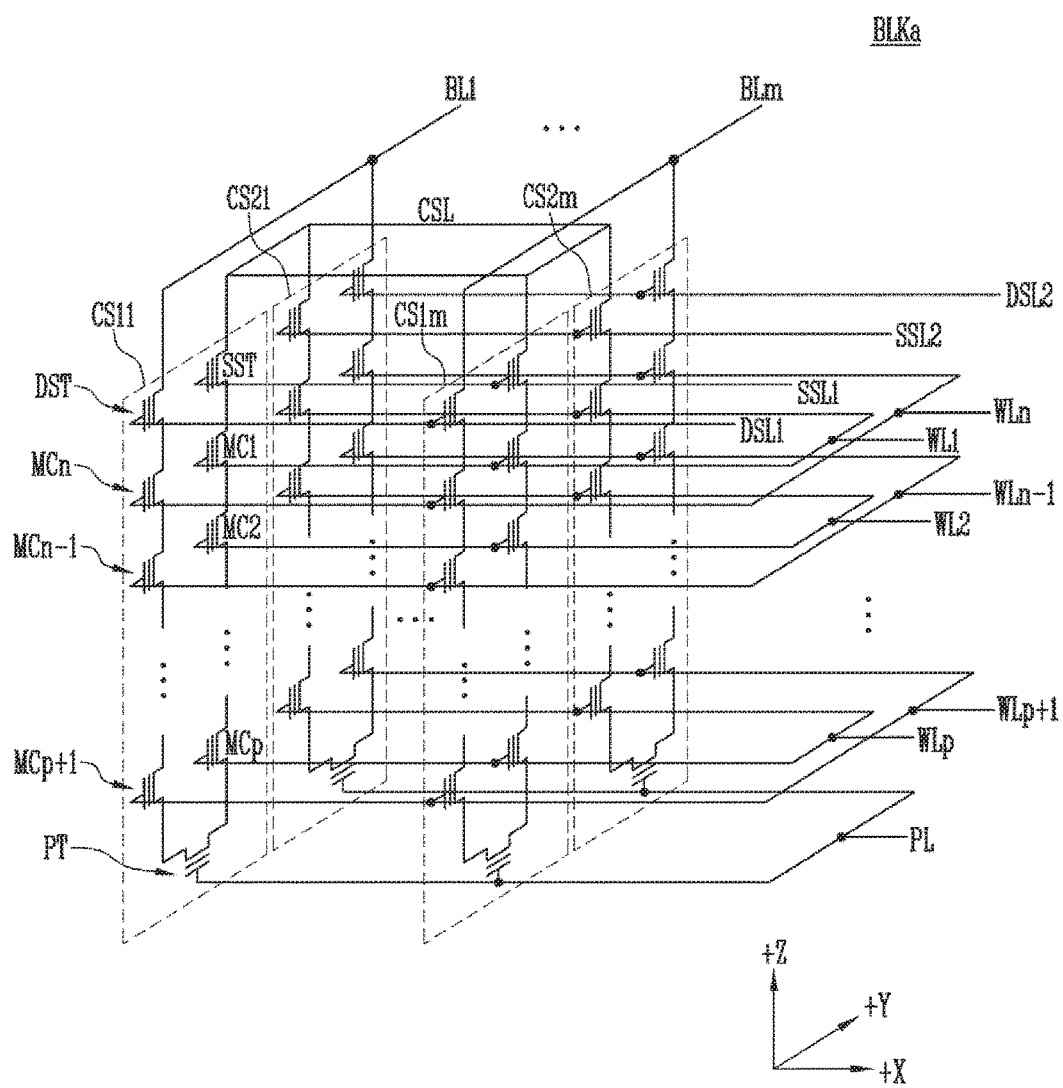
FIG. 4 is a circuit diagram illustrating any one memory block among memory blocks of FIG. 3.

FIG. 4 is a circuit diagram illustrating any one memory block BLKa among the memory blocks BLK1 to BLKz of FIG. 3.

Referring to FIG. 4, the memory block BLKa may include a plurality of cell strings CS11 to CS1m and CS21 to CS2m.

In an embodiment, each of the plurality of cell strings CS11 to CS1m and CS21 to CS2m may be formed in a 'U' shape. In the memory block BLKa, m cell strings are arranged in a row direction (i.e., a +X direction). In FIG. 4, it is illustrated that two cell strings are arranged in a column direction (i.e., a +Y direction). However, this is for convenience of description, and it will be understood that three cell strings may be arranged in the column direction.

Each of the plurality of cell strings CS11 to CS1m and CS21 to CS2m may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 4, the source select transistors of the cell strings CS11 to CS1m on a first row are coupled to a first source select line SSL1. The source select transistors of the cell strings CS21 to CS2m on a second row are coupled to a second source select line SSL2.

In another embodiment, the source select transistors of the cell strings CS11 to CS1m and CS21 to CS2m may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1m on the first row are coupled to a first drain select line DSL1. The drain select transistors of the cell strings CS21 to CS2m on the second row are coupled to a second drain select line DSL2.

Cell strings arranged in the column direction are coupled to a bit line extending in the column direction. In FIG. 4, the cell strings CS11 and CS21 on a first column are coupled to a first bit line BL1. The cell strings CS1m and CS2m on an mth column are coupled to an mth bit line BLm.

Memory cells coupled to the same word line in the cell strings arranged in the row direction constitute one page. For example, memory cells coupled to the first word line WL1 in the cell strings CS11 to CS1m on the first row constitute one page. Memory cells coupled to the first word line WL1 in the cell strings CS21 to CS2m on the second row constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1m or CS21 to CS2m arranged in the row direction may be coupled to the even bit lines, respectively, and odd-numbered cell strings among the cell strings is CS11 to CS1m or CS21 to CS2m arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. As a larger number of dummy memory cells are provided, the reliability of an operation of the memory block BLKa is improved. On the other hand, the size of the memory block BLKa is increased. As a smaller number of dummy memory cells are provided, the size of the memory block BLKa is decreased. On the other hand, the reliability of an operation of the memory block BLKa may be deteriorated.

In order to efficiently control the at least one dummy memory cell, the dummy memory cells may have a required threshold voltage. Before or after an erase operation of the memory block BLKa, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 5:
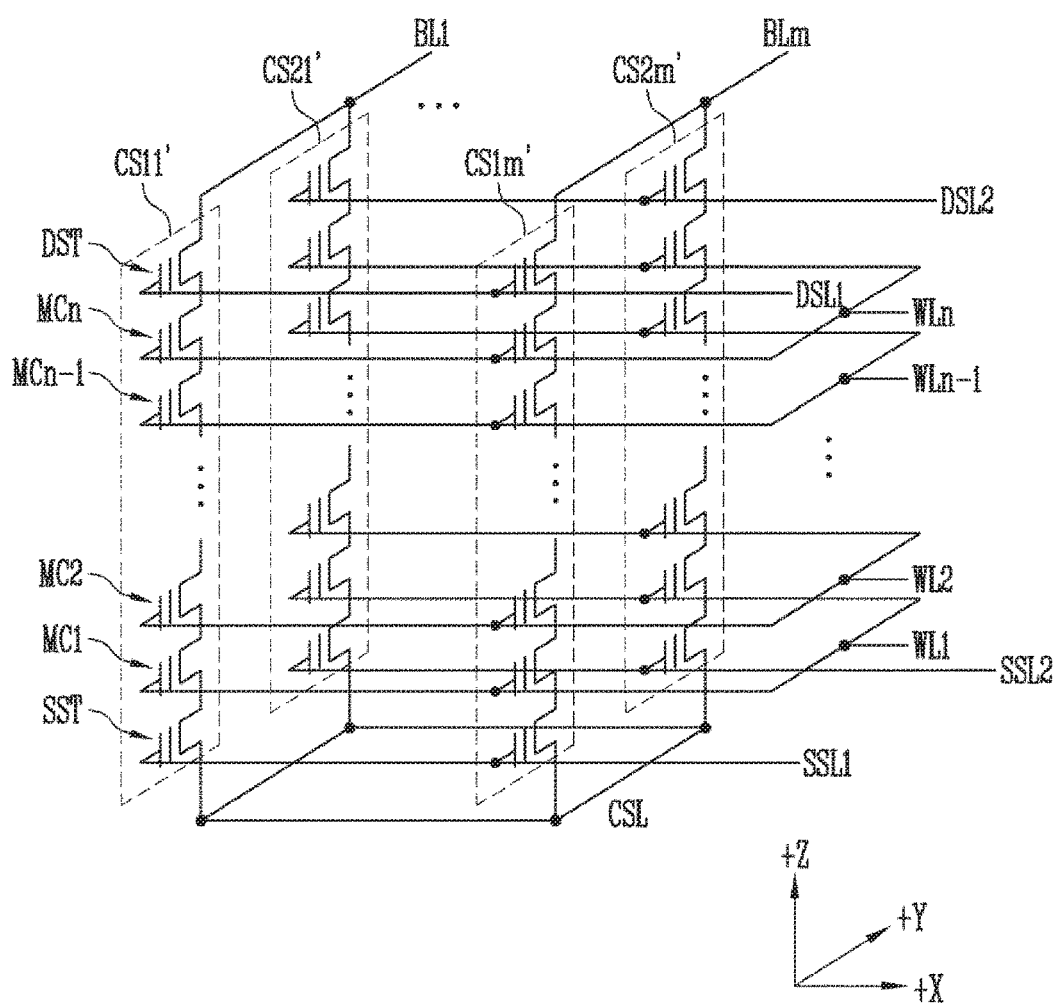
FIG. 5 is a circuit diagram illustrating another embodiment of the one memory block among the memory blocks of FIG. 3.

FIG. 5 is a circuit diagram illustrating another embodiment BLKb of the one memory block among the memory blocks BLK1 to BLKz of FIG. 3.

Referring to FIG. 5, the memory block BLKb may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' may include at least one source select transistor SST, first to nth memory cells MC1 to MCn, and at least one drain select transistor DST, which are stacked on a substrate (not shown) under the memory block BLKb.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1m' arranged on a first row are coupled to a first source select line SSL1. Source select transistors of the cell strings CS21' to CS2m' arranged on a second row are coupled to a second source select line SSL2. In another embodiment, the source select transistors of the cell strings CS11' to CS1m' and CS21' to CS2m' may be commonly coupled to one source select line.

The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn respectively.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1m' on the first row are coupled to a first drain select line DSL1. The drain select transistors of the cell strings CS21' to CS2m' on the second row are coupled to a second drain select line DSL2.

As a result, the memory block BLKb of FIG. 5 has a circuit similar to that of the memory block BLKa of FIG. 4. That is, the pipe transistor PT is excluded from each cell string in the memory block BLKb of FIG. 5.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be coupled to the even bit lines, respectively, and odd-numbered cell strings among the cell strings CS11' to CS1m" or CS21' to CS2m' arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. As a larger number of dummy memory cells are provided, the reliability of an operation of the memory block BLKb is improved. On the other hand, the size of the memory block BLKb is increased. As a smaller number of dummy memory cells are provided, the size of the memory block BLKb is decreased. On the other hand, the reliability of an operation of the memory block BLKb may be deteriorated.

In order to efficiently control the at least one dummy memory cell, the dummy memory cells may have a required threshold voltage. Before or after an erase operation of the memory block BLKb, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 6:
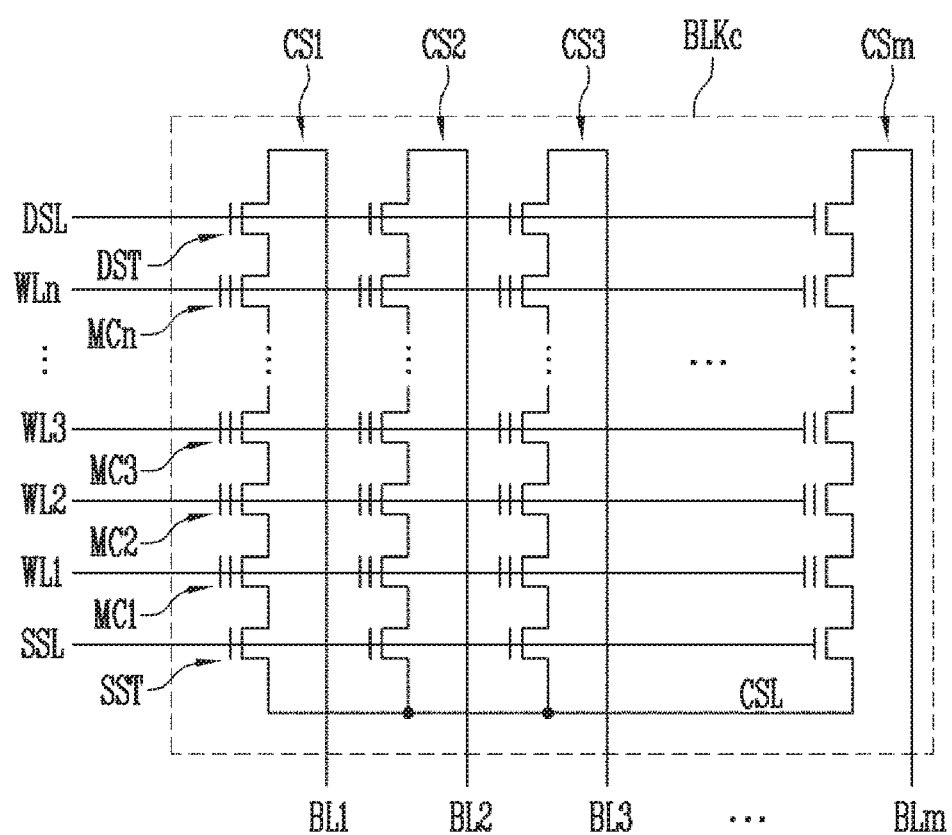
FIG. 6 is a circuit diagram illustrating an embodiment of any one memory block among a plurality of memory blocks included in the memory cell array of FIG. 2.

FIG. 6 is a circuit diagram illustrating an embodiment of any one memory block BLKc among the plurality of memory blocks BLK1 to BLKz included in the memory cell array 110 of FIG. 2.

Referring to FIG. 6, the memory block BLKc may include a plurality of strings CS1 to CSm. The plurality of strings CS1 to CSm may be coupled to a plurality of bit lines BL1 to BLm, respectively. Each of the plurality of strings CS1 to CSm may include at least one source select transistor SST, first to nth memory cells MC1 to MCn, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and the memory cells MC1 to MCn.

The first to nth memory cells MC1 to MCn of each cell string is coupled between the source select transistor SST and the drain select transistor DST.

The drain select transistor DST of each cell string is coupled between a corresponding bit line and the memory cells MC1 to MCn.

Memory cells coupled to the same word line constitute one page. As a drain select line DSL is selected, the cell strings CS1 to CSm may be selected. As any one of word lines WL1 to WLn is selected, one page among selected cell strings may be selected.

In another embodiment, even bit lines and odd bit lines may be provided instead of the first to mth bit lines BL1 to BLm. Even-numbered cell strings among the cell strings CS1 to CSm arranged may be coupled to the even bit lines, respectively, and odd-numbered cell strings among the cell strings CS1 to CSm may be coupled to the odd bit lines, respectively.

Figure 7:
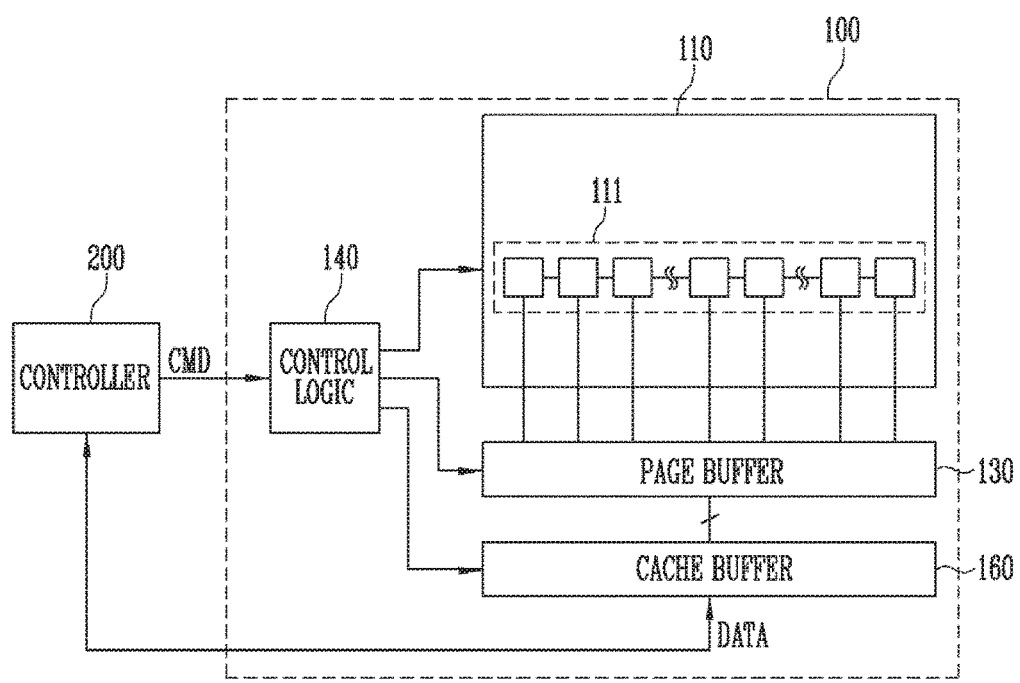
FIG. 7 is a block diagram illustrating operations of a page buffer and a cache buffer, which are shown in FIG. 2.

FIG. 7 is a block diagram illustrating operations of a conventional page buffer and a cache buffer.

Referring to FIG. 7, the memory cell array 110 may include a plurality of memory cells, and be accessed through the word lines WL and bit lines BL. Memory cells coupled to the same word line may constitute a page 111.

The controller 200 transfers a command CMD for controlling the semiconductor memory device 100 by receiving a command from the host (e.g., host 300 of FIG. 1). For example, when a read command is received together with a logical address corresponding to the page 111 from the host, the controller 200 transfers a read command CMD and a physical address corresponding to the logical address to the semiconductor memory device 100.

The control logic 140 controls the peripheral circuit (not shown) such that data stored in each of the memory cells is transferred to the page buffer 130, based on the received command CMD and the received address. The data DATA transferred to the page buffer 130 is transferred to the controller 200 through the cache buffer 160. In FIG. 7, illustration of the input/output interface 170 shown in FIG. 2 is omitted. However, it will be understood that the data transferred to the cache buffer 160 is transferred to the controller 200 through the input/output interface. The controller 200 transfers the data DATA transferred from the semiconductor memory device 100 to the host.

In general, when the controller 200 exchanges data with the semiconductor memory device 100, page data corresponding to one page 111 is recorded in the memory cell array 110 or read from the memory cell array 110 through the page buffer 130.

When the controller 200 transfers a command for allowing the semiconductor memory device 100 to read page data, the page data is transferred from the memory cell array 110 to the page buffer 130.

In a semiconductor memory device to which the cache buffer 160 is not applied, the semiconductor memory device is allowed to start a new operation only after data of the page buffer 130 is completely transferred to the controller 200. Thus, in order to increase the throughput of the storage device, the semiconductor memory device 100 according to the embodiment of the present disclosure additionally may include the cache buffer 160 in addition to the page buffer 130.

According to the semiconductor memory device 100 including the cache buffer 160, page data of the memory cell array 110 is sensed by the page buffer 130 and then the page data is immediately transferred to the cache buffer 160. When the page data is transferred from the page buffer 130 to the cache buffer 160, the page buffer 130 is reset to read a next page. The page data is still stored in the cache buffer 160. Accordingly, even before previous page data is completely transferred from the cache buffer 160 to the controller 200, another page data of the memory cell array 110 can be sensed by the page buffer 130. Thus, by employing the cache buffer 160, the transfer delay time in consecutive read operations of page data can be reduced. Consequently, the total throughput of the storage device can be increased.

As described above, in a read operation using the cache buffer 160, the semiconductor memory device 100 operates in the cache state. On the contrary, in a general read operation, the semiconductor memory device 100 operates in the normal state. The controller 200 may monitor whether the semiconductor memory device 100 operates in the cache state or operates in the normal state. For example, the controller 200 determines whether the semiconductor memory device 100 operates in the cache state or operates in the normal state, based on the type of command transferred to the semiconductor memory device 100 and whether the semiconductor memory device 100 has been completed in response to the corresponding command.

In particular, when a normal command is received in a situation in which the semiconductor memory device 100 operates in the cache state, the semiconductor memory device 100 may cause malfunction or enter into an abnormal state. Therefore, before the controller 200 transfers a command to the semiconductor memory device 100, the controller 200 checks the kind of the corresponding command and the current cache-normal state of the semiconductor memory device 100.

When the controller 200 transfers a normal command to the semiconductor memory device 100 in a situation in which the semiconductor memory device 100 currently operates in the cache state, the controller 200 transfers a cache completion command to allow the semiconductor memory device 100 to complete a cache operation and switches its state to the normal state. The controller 200 transfers the normal command only after the semiconductor memory device 100 receiving the cache completion command performs a cache completion operation and switches its state to the normal state. This procedure is required to prevent malfunction that may be caused when the semiconductor memory device 100 receives the normal command without switching its state in a situation in which the semiconductor memory device 100 operates in the cache state. The above-described operation be described in detail with reference to FIGS. 10 and 11.

As described above, when the controller 200 monitors the cache-normal state of the semiconductor memory device 100, the configuration of the controller is complicated. In particular, in a storage device configured such that one controller controls a plurality of semiconductor memory devices, the controller is to monitor all cache-normal states of the plurality of semiconductor memory devices, and therefore, the complexity of the controller is further increased.

According to the embodiment of the present disclosure, the semiconductor memory device autonomously checks its cache-normal state, and performs a cache completion operation, based on a received command type. Thus, the controller 200 can transfer a generated command without monitoring the cache-normal state of the semiconductor memory device 100. Accordingly, the controller 200 can be more simply configured.

Figure 8A:
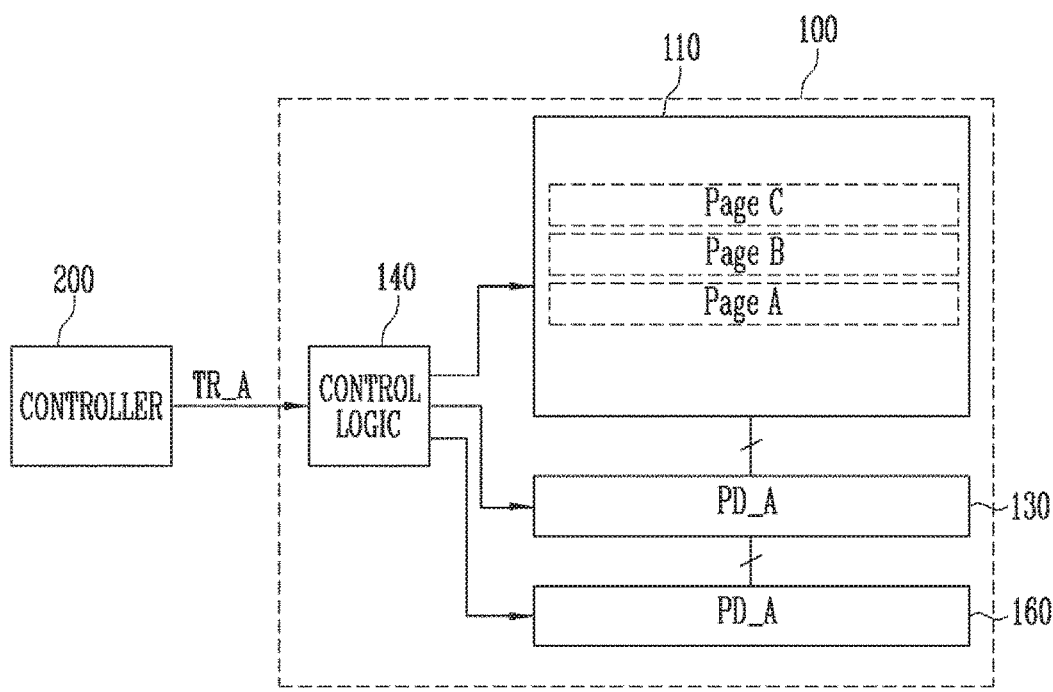
FIGS. 8A and 8B are block diagrams illustrating a normal operation and a normal state of the semiconductor memory device.
Figure 8B:
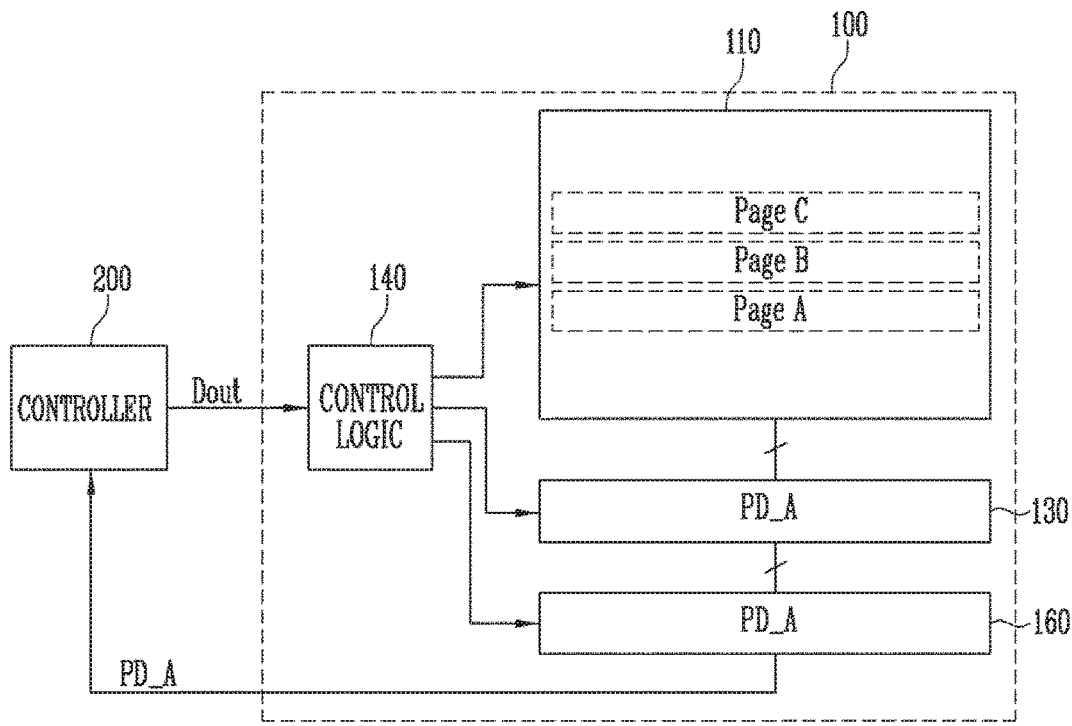

FIGS. 8A and 8B are block diagrams illustrating a normal operation and a normal state of the semiconductor memory device 100. In particular, a normal read operation is illustrated in FIGS. 8A and 8B.

Referring to FIG. 8A, the controller 200 transfers a normal data transfer command TR_A for page A to the semiconductor memory device 100. The normal data transfer command TR_A may be included in a normal command. The normal data transfer command TR_A may be a command for transferring data stored in the page A to the page buffer 130. When the normal data transfer command TR_A is transferred, the control logic 140 controls the page buffer 130 to sense data stored in the page A of the memory cell array 110. Accordingly, data PD_A stored in the page A is sensed by the page buffer 130. Subsequently, the data PD_A stored in the page A is transferred to the cache buffer 160.

Referring to FIG. 8B, after an operation corresponding to the normal data transfer command TR_A is completed, a data output command Dout is transferred from the controller 200 to the semiconductor memory device 100. The data output command Dout may be a command for outputting data stored in the cache buffer 160 to the controller 200. When the data output command Dout is transferred, the control logic 140 controls the cache buffer 160 such that the data PD_A stored in the cache buffer 160 is transferred to the controller 200 through the input/output interface (not shown). A read operation on the page A is completed by the normal data transfer command TR_A shown in FIG. 8A and the data output command Dout shown in FIG. 8B. Subsequently, a read operation on data stored in another page may also be performed similar to the procedures shown in FIGS. 8A and 8B.

According to FIGS. 8A and 8B, it can be seen that the semiconductor memory device 100 operates in the normal state since the normal data transfer command TR_A and the data output command Dout are transferred to the semiconductor memory device 100. In the normal state, data stored in the page buffer 130 and the cache buffer 160 of the semiconductor memory device 100 may be substantially same.

FIGS. 9A, 9B, 9C, 9D, and 9E are block diagrams illustrating a cache operation and a cache state of the semiconductor memory device 100. In particular, a cache read operation is illustrated in FIGS. 9A to 9D.

Figure 9A:
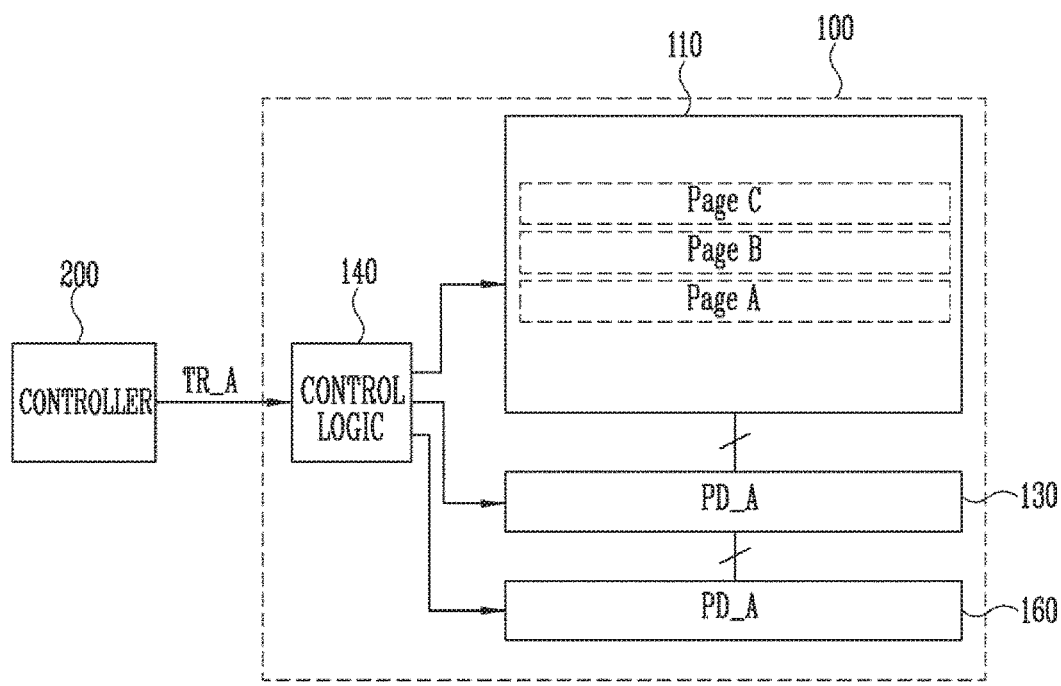
FIGS. 9A, 9B, 9C, 9D, and 9E are block diagrams illustrating a cache operation and a cache state of the semiconductor memory device.

Referring to FIG. 9A, the controller 200 transfers a normal data transfer command TR_A for page A to the semiconductor memory device 100, similar to the procedure shown in FIG. 8A. Therefore, overlapping descriptions will be omitted.

Figure 9B:
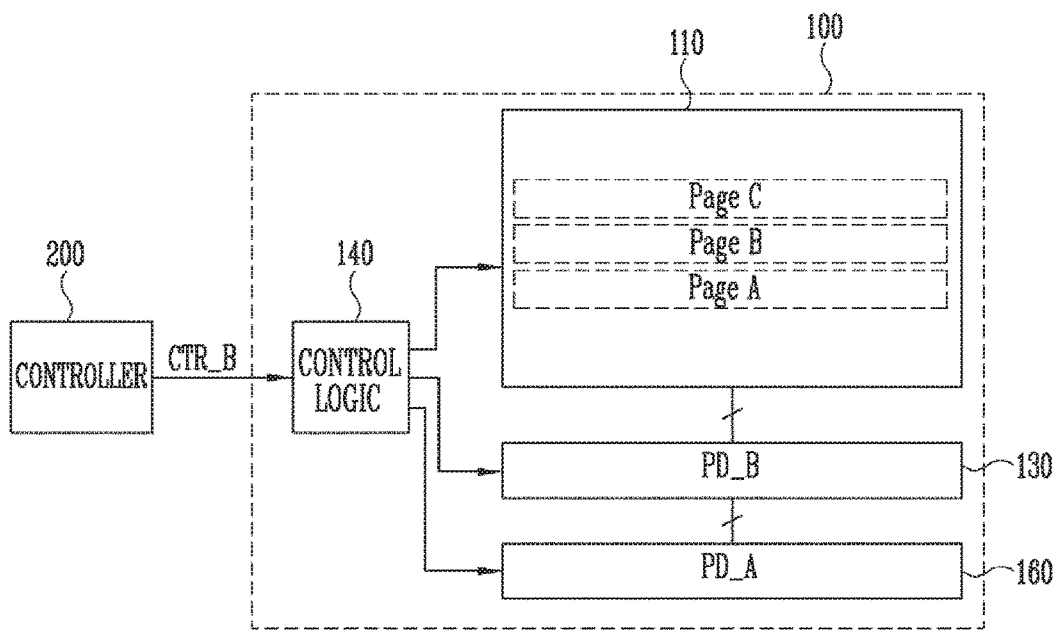

Referring to FIG. 9B, when a cache read operation on page B is to be performed in a state in which data PD_A is stored in the cache buffer 160, the controller 200 transfers a cache data transfer command CTR_B for the page B to the semiconductor memory device 100. The cache data transfer command CTR_B may be included in a cache command. The cache data transfer command CTR_B may be a command for transferring data stored in the page B to the page buffer 130 in a state in which the data PD_A stored in the cache buffer 160 is maintained. When the cache data transfer command CTR_B is transferred, the control logic 140 controls the page buffer 130 to sense data stored in the page B of the memory cell array 110. Accordingly, data PD_B stored in the page B is sensed by the page buffer 130. Although the data PD_B is stored in the page buffer 130, the data PD_A of the cache buffer 160 is maintained.

Figure 9C:
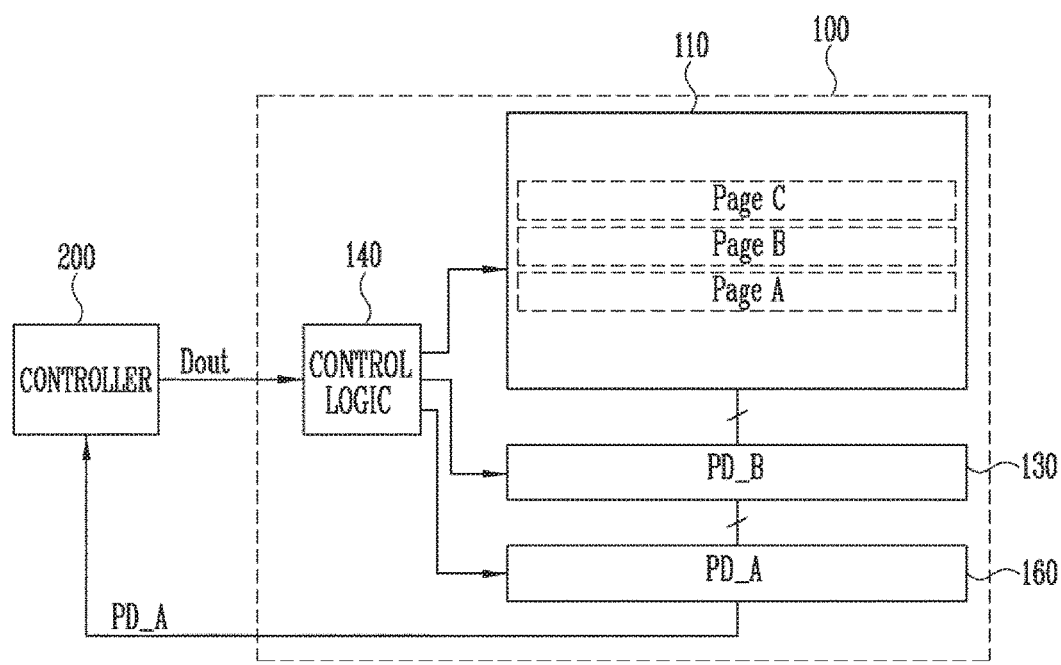

Referring to FIG. 9C, after an operation corresponding to the cache data transfer command CTR_B is completed, a data output command Dout is transferred from the controller 200 to the semiconductor memory device 100. The data output command Dout may be a command for outputting data stored in the cache buffer 160 to the controller 200. When the data output command Dout is transferred, the control logic 140 controls the cache buffer 160 such that the data PD_A stored in the cache buffer 160 is transferred to the controller 200 through the input/output interface (not shown).

Figure 9D:
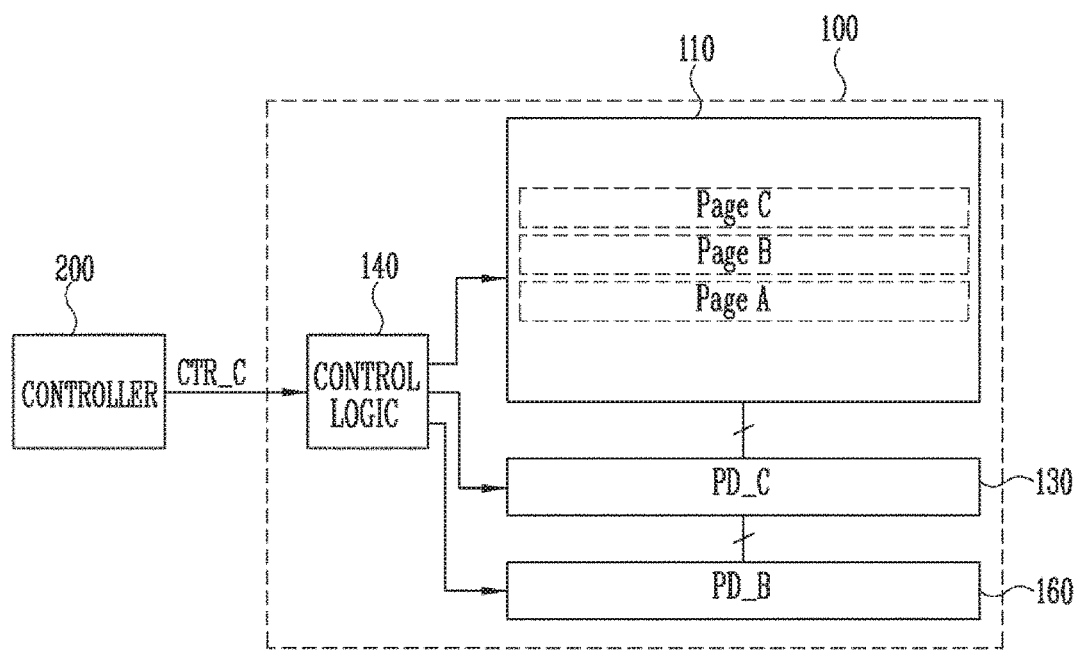

When the transfer of the data PD_A to the controller 200 is completed in FIG. 9C, the cache buffer 160 may store the data PD_B stored in the page buffer 130 as shown in FIG. 9D. Referring to FIG. 9D, in the state in which the data PD_B is stored in the cache buffer 160, the controller 200 transfers a cache data transfer command CTR_C for page C to the semiconductor memory device 100. The cache data transfer command CTR_C may be a command for transferring data stored in the page C to the page buffer 130 in a state in which the data PD_B stored in the cache buffer 160 is maintained. When the cache data transfer command CTR_C is transferred, the control logic 140 controls the page buffer 130 to sense data stored in the page C of the memory cell array 110. Accordingly, data PD_C stored in the page C is sensed by the page buffer 130. Although the data PD_C is stored in the page buffer 130, the data PD_B of the cache buffer 160 is maintained.

Figure 9E:
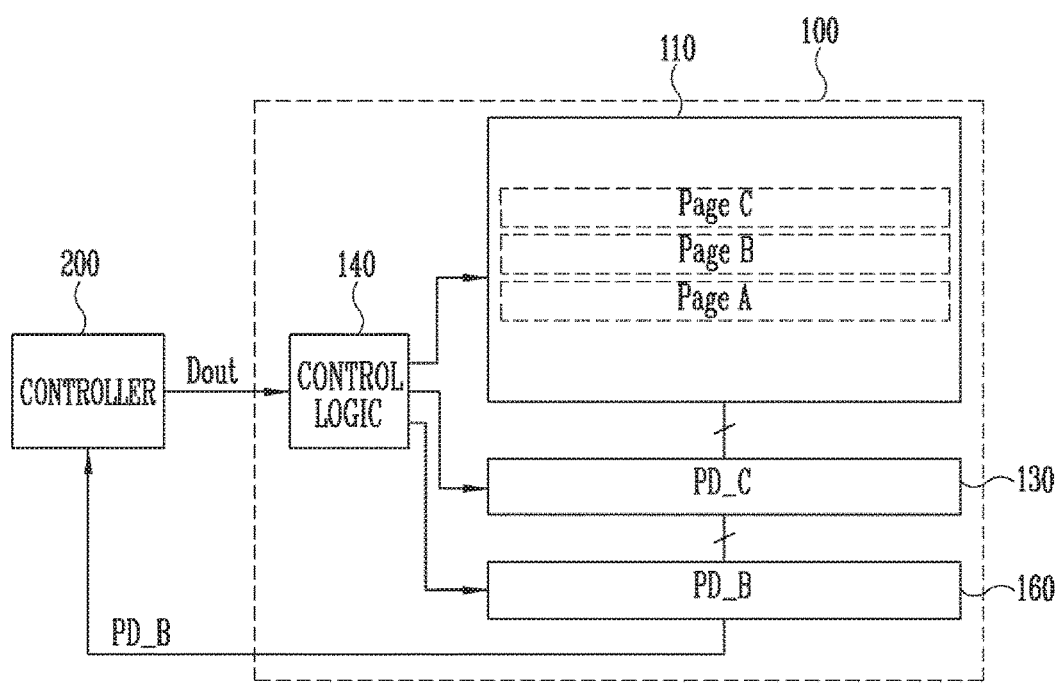

Referring to FIG. 9E, after an operation corresponding to the cache data transfer command CTR_C is completed, a data output command Dout is transferred from the controller 200 to the semiconductor memory device 100. The data output command Dout may be a command for outputting data stored in the cache buffer 160 to the controller 200. When the data output command Dout is transferred, the control logic 140 controls the cache buffer 160 such that the data PD_B stored in the cache buffer 160 is transferred to the controller 200 through the input/output interface (not shown).

As shown in FIGS. 9A to 9E, when the semiconductor memory device 100 operates in response to the cache data transfer commands CTR_B and CTR_C, the semiconductor memory device 100 maintains a cache state. In the cache state, data stored in the page buffer 130 and the cache buffer 160 may be different from each other. When a normal command is received in a situation in which the semiconductor memory device 100 operates in the cache state, the semiconductor memory device 100 may erroneously operate. Therefore, the normal command is to be received after the semiconductor memory device 100 performs a cache completion operation.

In an embodiment, the cache completion operation may include an operation of transferring both of the data PD_B stored in the cache buffer 160 and the data PD_C stored in the page buffer 130 to the controller 200, without additional data sensing of the page buffer 130, for example, in the situation in FIG. 9E. For example, the data PD_B stored in the cache buffer 160 may be first transferred to the controller 200. When the transfer of the data PD_B is completed, the cache buffer 160 stores the data PD_C stored in the page buffer 130. Subsequently, the data PD_C stored in the cache buffer 160 may be transferred to the controller 200. Subsequently, the cache buffer 160 and the page buffer 130 may be reset. The cache completion operation may be performed in the same manner described above, and the normal command may be transferred to the semiconductor memory device 100 after the cache completion operation is performed.

In another embodiment, the cache completion operation may include an operation of transferring the data PD_B stored in the cache buffer 160 and resetting the cache buffer 160 and the page buffer 130, without additional data sensing of the page buffer 130, for example, in the situation of FIG. 9E. For example, the data PD_B stored in the cache buffer 160 may be transferred to the controller 200. After the transfer of the data PD_B is completed, the cache buffer 160 and the page buffer 130 may be reset. The data PD_C stored in the page buffer 130 is not transferred to the controller 200 but may be discarded. The cache completion operation may be performed in the same manner described above, and the normal command may be transferred to the semiconductor memory device 100 after the cache completion operation is performed.

In still another embodiment, the cache completion operation may include an operation of resetting the cache buffer 160 and the page buffer 130, without outputting data, for example, in the situation of FIG. 9E. The data PD_B and PD_C are not transferred to the controller 200, but the cache buffer 160 and the page buffer 130 are reset. The cache completion operation may be performed in the same manner described above, and the normal command may be transferred to the semiconductor memory device 100 after the cache completion operation is performed.

Figure 10:
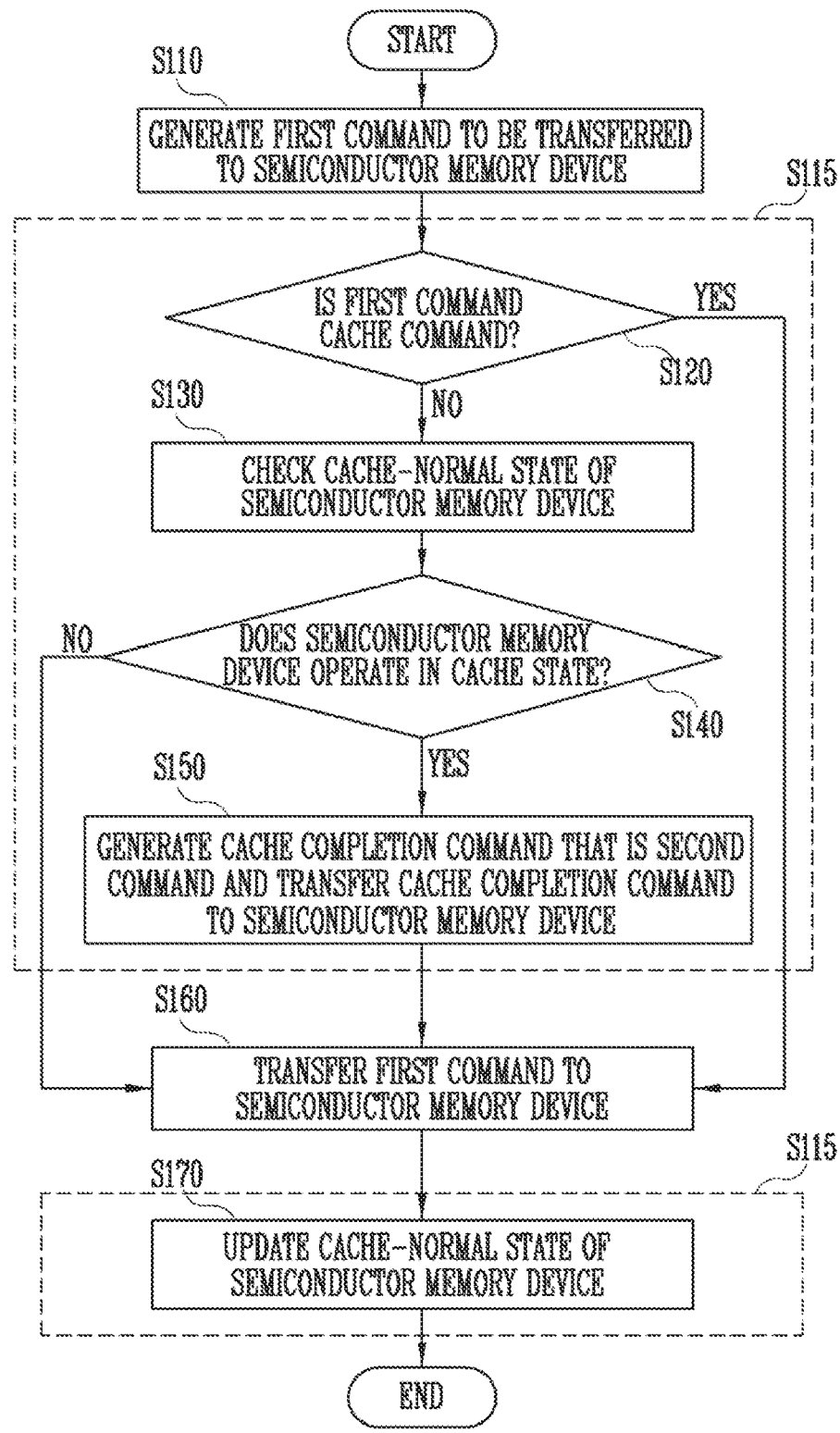
FIG. 10 is a flowchart illustrating an operating method of a controller that manages a cache-normal state.

FIG. 10 is a flowchart illustrating an operating method of a controller that manages a cache-normal state according to a prior art.

Referring to FIG. 10, in step S110, the controller 200 generates a first command to be transferred to the semiconductor memory device 100.

Subsequently, in step S115, a control operation is performed according to the cache-normal state of the semiconductor memory device 100. In more detail, in step S120, it is determined whether the generated first command is a cache command or a normal command.

When the first command is the cache command (that is, "YES" in step S120), the first command may be transferred to the semiconductor memory device 100 without any cache completion operation, regardless of the cache-normal state of the semiconductor memory device 100. Therefore, the first command that is the cache command may be transferred to the semiconductor memory device 100 by proceeding to step S160.

When the first command is the normal command (that is, "NO" at step S120), it is determined whether a cache completion operation is to be performed according to the cache-normal state of the semiconductor memory device 100. First, in step S130, the cache-normal state of the semiconductor memory device 100 is checked.

In an example, the cache-normal state of the semiconductor memory device 100 may be checked through commands that were transferred to the semiconductor memory device 100 right before the first command. For example, when the lastly transferred command prior to the first command is a cache command, the semiconductor memory device 100 may operate in the cache state. Meanwhile, when the lastly transferred command prior to the first command is a normal command, the semiconductor memory device 100 may operate in the normal state.

In another example, semiconductor memory device 100 may refer to a register that stores information about the cache-normal state. The information about the cache-normal state of the semiconductor memory device 100 may be stored in a separate register provided in the controller 200.

Subsequently, when the semiconductor memory device 100 operates in the cache state as the determination result of step S140 (that is, "YES" at step S140), the semiconductor memory device 100 is to be controlled to perform the cache completion operation before the first command that is the normal command is transferred to the semiconductor memory device 100. Accordingly, the controller 200 generates a cache completion command that is a second command different from the first command and transfers the cache completion command to the semiconductor memory device 100 at step S150. When the cache completion command is received, the semiconductor memory device 100 may perform the cache completion operation.

When the cache completion operation of the semiconductor memory device 100 is performed, the first command that is the normal command is transferred to the semiconductor memory device 100 at step S160.

When the semiconductor memory device 100 operates in the normal state as the determination result of the step S140 (that is, "NO" at step S140), the first command is transferred to the semiconductor memory device 100 by immediately proceeding to the step S160.

Subsequently, in step S170, the cache-normal state of the semiconductor memory device 100 is updated. When the information about the cache-normal state of the semiconductor memory device 100 is stored in the register provided in the controller 200 as described above, the information of the register is updated to reflect the cache-normal state of the semiconductor memory device 100.

Referring to FIG. 10, the steps S120, S130, S140, S150, and S170 correspond to the step S115 of performing the control operation according to the cache-normal state of the semiconductor memory device 100. According to the prior art, as the controller 200 performs the step S115 of performing the control operation according to the cache-normal state of the semiconductor memory device 100 as shown in FIG. 10, the configuration of the controller 200 is complicated, and production cost increases.

According to the embodiment of the present disclosure, an operation corresponding to the step S115 of performing the control operation according to the cache-normal state is internally performed in the semiconductor memory device 100. Accordingly, an operation configuration of the controller 200 can be simplified.

FIG. 11 is a flowchart illustrating an operation of the semiconductor memory device 100 according to a prior art.

Referring to FIG. 11, an operation of the semiconductor memory device 100 when the controller 200 performs the steps shown in FIG. 10 is illustrated. In step S210, a first command is received from the controller 200. The first command may be a normal command or a cache command. Meanwhile, in step S230, an operation corresponding to the received first command is performed. That is, in a semiconductor memory device coupled to the controller that performs the operation according to FIG. 10, the semiconductor memory device performs an operation corresponding to the received command, and does not perform any separate monitoring operation.

FIG. 12 is a flowchart illustrating an operating method of the controller 200 that controls the semiconductor memory device 100 that manages the cache-normal state according to an embodiment of the present disclosure.

Referring to FIG. 12, the controller 200 generates a first command to be transferred to the semiconductor memory device 100 at step S310. The first command may be a normal command or a cache command. Subsequently, in step S330, the generated first command is transferred to the semiconductor memory device 100. That is, the controller 200 transfers the generated command to the semiconductor memory device 100 without checking the cache-normal state of the semiconductor memory device 100, regardless of the type of the generated command. As shown in FIG. 12, it is unnecessary for the controller 200 coupled to the semiconductor memory device 100 according to the embodiment of the present disclosure to perform the step S115 shown in FIG. 10. Accordingly, the operation and the configuration of the controller 200 can be simplified.

FIG. 13 is a flowchart illustrating an operating method of the semiconductor memory device 100 that manages the cache-normal state according to an embodiment of the present disclosure.

Referring to FIG. 13, in step S410, the semiconductor memory device 100 receives a first command from the controller 200. Subsequently, in step S415, an operation is performed according to the cache-normal state of the semiconductor memory device 100. In more detail, in step S420, it is determined whether the received first command is a cache command or a normal command.

When the first command is the cache command (that is, "YES" at step S420), the first command may be transferred to the semiconductor memory device 100 without any cache completion operation, regardless of the cache-normal state of the semiconductor memory device 100. Therefore, an operation corresponding to the first command is performed by proceeding to step S460.

When the first command is the normal command (that is, "NO" at step S420), it is determined whether a cache completion operation is to be performed according to the cache-normal state of the semiconductor memory device 100. First, in step S430, the cache-normal state of the semiconductor memory device 100 is checked.

In an example, the semiconductor memory device 100 may refer to a register that stores information about the cache-normal state. The information about the cache-normal state of the semiconductor memory device 100 may be stored in a separate register provided in the semiconductor memory device 100.

Subsequently, when the semiconductor memory device 100 operates in the cache state as the determination result of step S440 (that is, "YES" at step S440), the cache completion operation is to be performed before the operation corresponding to the first command is performed. Accordingly, the first command is temporarily stored, and the cache completion operation is first performed at step S450.

When the cache completion operation of the semiconductor memory device 100 is performed, an operation corresponding to the first command that is the normal command is performed at step S460.

When the semiconductor memory device 100 operates in the normal state as the determination result of the step S440 (that is, "NO" at step S440), the operation corresponding to the first command is performed by immediately proceeding to step S460.

Subsequently, in step S470, the information about the cache-normal state of the semiconductor memory device 100 is updated. When the information about the cache-normal state of the semiconductor memory device 100 is stored in the register provided in the semiconductor memory device 100 as described above, the information of the register is updated to reflect the cache-normal state of the semiconductor memory device 100.

Referring to FIG. 13, the steps S420, S430, S440, S450, and S470 correspond to the step at step S415 of performing the operation according to the cache-normal state of the semiconductor memory device 100. According to the embodiment of the present disclosure, an operation corresponding to a received command is appropriately performed by internally managing the cache-normal state in the semiconductor memory device 100. Accordingly, an operation of the controller 200 is simplified as shown in FIG. 12, and the controller 200 can be configured at less cost.

The embodiment shown in FIG. 13 illustrates that the step at step S415 of updating the information about the cache-normal state of the semiconductor memory device is performed after the step at step S460 of performing the operation corresponding to the first command. However, this is merely illustrative, and the operating method of the semiconductor memory device according to the embodiment of the present disclosure is not limited thereto.

In an example, when the first command is the normal command, and the cache-normal state of the semiconductor memory device is the cache state, after the cache completion operation is performed at step S450, the information about the cache-normal state of the semiconductor memory device 100 may be first updated from the cache state to the normal state, and the operation corresponding to the first command may be then performed.

In another example, when the first command is the cache command, and the cache-normal state of the semiconductor memory device is the normal state, after the determination of the step S420, the information about the cache-normal state of the semiconductor memory device may be first updated from the normal state to the cache state, and the operation corresponding to the first command may be then performed.

Figure 14:
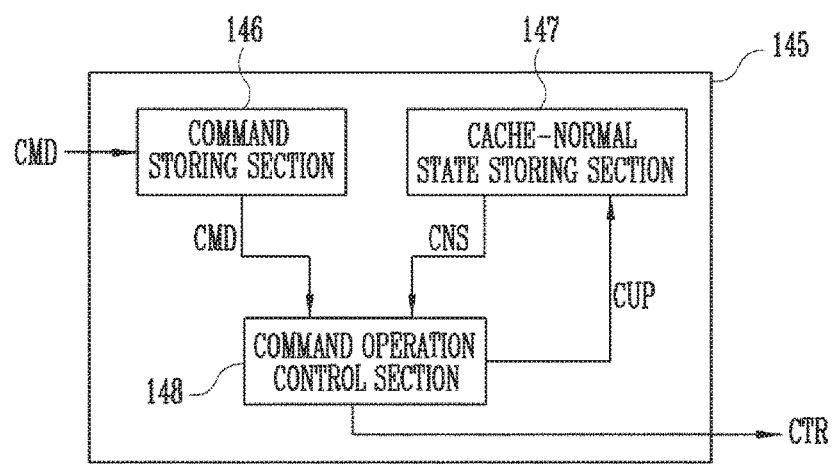
FIG. 14 is a block diagram illustrating an example of a cache state processor of FIG. 2.

FIG. 14 is a block diagram illustrating an example of the cache state processor of FIG. 2.

Referring to FIG. 14, the cache state processor 145 may include a command storing section 146, a cache-normal state storing section 147, and a command operation control section 148.

The command storing section 146 may store a command CMD transferred from the controller 200 to the semiconductor memory device 100. The cache-normal state storing section 147 stores a current cache-normal state CNS of the semiconductor memory device 100. As described above, the cache-normal state storing section 147 may be implemented with a register for storing the information about the cache-normal state of the semiconductor memory device 100.

The command CMD stored in the command storing section 146 is transferred to the command operation control section 148, and the information about the cache-normal state CNS stored in the cache-normal state storing section 147 is transferred to the command operation control section 148. The command operation control section 148 controls an operation of the semiconductor memory device 100, based on the received command CMD and the received information about the cache-normal state CNS. More specifically, the command operation control section 148 may control operations of the cache buffer 160 and the page buffer 130 by generating a control signal CTR. In addition, the command operation control section 148 may control operations of the voltage generator 150, the address decoder 120, and the input/output interface 170, which are shown in FIG. 1.

More specifically, when the received command CMD is a normal command, and the information about the received cache-normal state CNS represents a cache state, the command operation control section 148 may control operations of the cache buffer 160 and the page buffer 130 to perform a cache completion operation. After the cache completion operation is performed, the command operation control section 148 may control operations of the cache buffer 160 and the page buffer 130 to perform an operation corresponding to the received command CMD.

When the received command CMD is a cache command, the command operation control section 148 may control operations of the cache buffer 160 and the page buffer 130 to perform the operation corresponding to the received command CMD, regardless of the information about the cache-normal state CNS. Meanwhile, when the received command CMD is the normal command, and the cache-normal state CNS is a normal state, the command operation control section 148 may control operations of the cache buffer 160 and the page buffer 130 to perform the operation corresponding to the received command CMD.

Meanwhile, when the cache-normal state of the semiconductor memory device 100 is changed as the received command CMD is processed, the command operation control section 148 transfers an update signal CUP to the cache-normal state storing section 147. Accordingly, the information about the current cache-normal state CNS of the semiconductor memory device 100, which is stored in the cache-normal state storing section 147, is updated.

According to FIGS. 2 and 14, there is illustrated an embodiment in which the cache state processor 145 is included in the control logic 140. However, this is merely illustrative, and the cache state processor 145 may be configured separately from the control logic 140.

As described above, the control logic 140 of the semiconductor memory device 100 according to the embodiment of the present disclosure controls operations of the page buffer 130 and the cache buffer 160, based on the cache-normal state of the semiconductor memory device 100. More specifically, the cache state processor 145 included in the control logic 140 controls operations of the page buffer 130 and the cache buffer 160 to perform the cache completion operation, based on the current cache-normal state of the semiconductor memory device 100 and the type of the received command CMD.

Accordingly, it is unnecessary to monitor the cache-normal state of the semiconductor memory device 100. Consequently, the configuration of the controller 200 can be simplified.

Figure 15:
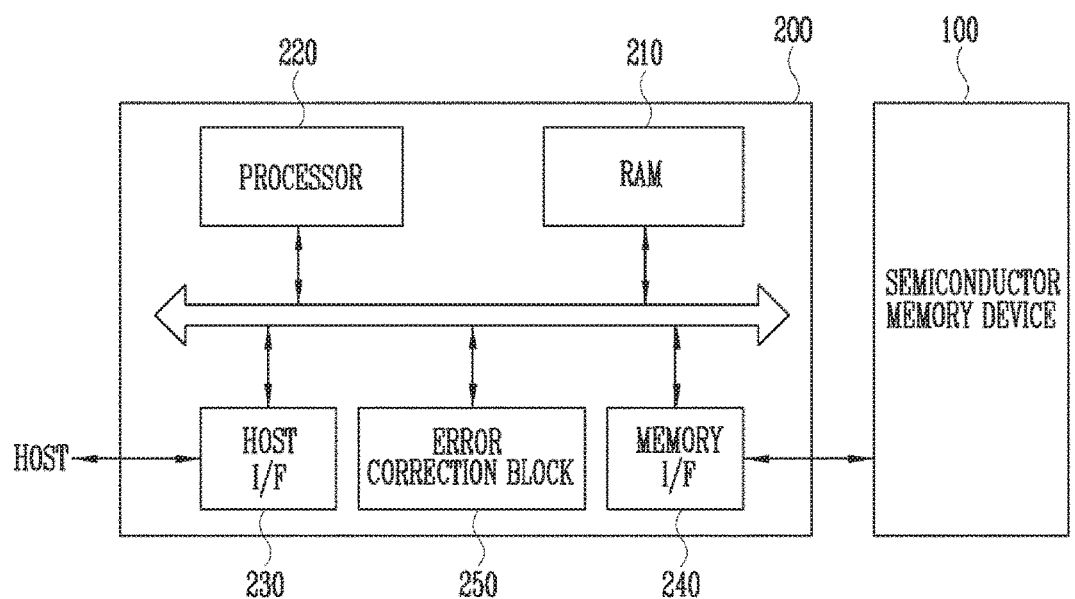
FIG. 15 is a block diagram illustrating an example of the controller shown in FIG. 1.

FIG. 15 is a block diagram illustrating an example of the controller shown in FIG. 1.

Referring to FIG. 15, the controller 200 is coupled to a semiconductor memory device 100 and a host HOST. The semiconductor memory device 100 may be the semiconductor memory device described with reference to FIG. 2. The controller 200 corresponds to the controller 200 of FIG. 1. Hereinafter, overlapping descriptions will be omitted.

The controller 1100 is configured to access the semiconductor memory device 100 in response to a request from the host HOST. For example, the controller 1100 is configured to control read, write, erase, and background operations of the semiconductor memory device 100. The controller 1100 is configured to provide an interface between the semiconductor memory device 100 and the host HOST. The controller 1100 is configured to drive firmware for controlling the semiconductor memory device 100.

The controller 1100 may include a random access memory (RAM) 210, a processor 220, a host interface 230, a memory interface 240, and an error correction block 250. The RAM 1110 is used as at least one of a working memory of the processor 220, a cache memory between the semiconductor memory device 100 and the host HOST, and a buffer memory between the semiconductor memory device 100 and the host HOST. The processor 220 controls the overall operations of the controller 1100. Also, the controller 1100 may arbitrarily store program data provided from the host HOST in a write operation.

The host interface 230 may include a protocol for exchanging data between the host HOST and the controller 1100. In an exemplary embodiment, the controller 1100 is configured to communicate with the host HOST through at least one of various interface protocols such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, an Integrated Drive Electronics (IDE) protocol, and a private protocol.

The memory interface 240 interfaces with the semiconductor memory device 100. For example, the memory interface 240 may include a NAND interface or a NOR interface.

The error correction block 250 is configured to detect and correct an error of data received from the semiconductor memory device 100 by using an error correction code (ECC). The processor 220 may control the semiconductor memory device 100 to adjust a read voltage, based on an error detection result of the error correction block 250, and to perform re-reading. In an exemplary embodiment, the error correction block 250 may be provided as a component of the controller 1100.

The controller 1100 and the semiconductor memory device 100 may be integrated into one semiconductor device. In an exemplary embodiment, the controller 1100 and the semiconductor memory device 100 may be integrated into one semiconductor device, to constitute a memory card. For example, the controller 1100 and the semiconductor memory device 100 may be integrated into one semiconductor device, to constitute a memory card such as a PC card (Personal Computer Memory Card International Association (PCMCIA)), a Compact Flash (CF) card, a Smart Media Card (SM or SMC), a memory stick, a Multi-Media Card (MMC, RS-MMC or MMCmicro), an SD Card (SD, miniSD, microSD or SDHC), or a Universal Flash Storage (UFS).

The controller 1100 and the semiconductor memory device 100 may be integrated into one semiconductor device to constitute a semiconductor drive (solid state drive (SSD)). The semiconductor drive SSD may include a storage device configured to store data in a semiconductor memory. When the storage device including the controller 200 and the semiconductor memory device 100 is used as the semiconductor drive SSD, the operating speed of the host HOST coupled to the storage device can be remarkably improved.

In another example, the storage device including the controller 200 and the semiconductor memory device 100 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multimedia Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an exemplary embodiment, the semiconductor memory device 100 and the storage device including the same may be packaged in various forms. For example, the semiconductor memory device 100 or the storage device may be packaged in a manner such as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), Thin Quad Flat Pack (TQFP), System In Package (SIP), Mufti-Chip Package (MCP), Wafer-level Fabricated Package (WFP), or Wafer-level processed Stack Package (WSP).

Figure 16:
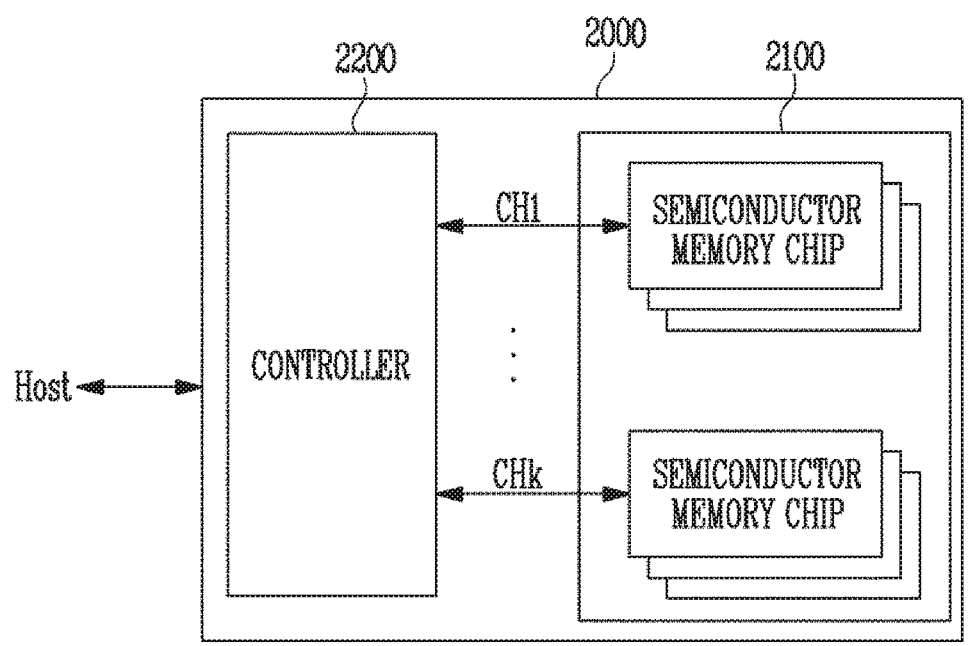
FIG. 16 is a block diagram illustrating an application example of the storage device shown in FIG. 1.

FIG. 16 is a block diagram illustrating an application example of the storage device shown in FIG. 1.

Referring to FIG. 16, the storage device may include a semiconductor memory device 2100 and a controller 2200. The semiconductor memory device 2100 may include a plurality of semiconductor memory chips. The plurality of semiconductor memory chips are divided into a plurality of groups.

FIG. 16 illustrates that the plurality of groups communicate with the controller 2200 through first to kth channels CH1 to CHk. Each semiconductor memory chip may be configured and operated identically to the semiconductor memory device 100 described with reference to FIG. 2.

Each group is configured to communicate with the controller 2200 through one common channel. The controller 2200 is configured similarly to the controller 200 described with reference to FIG. 15. The controller 2200 is configured to control the plurality of memory chips of the semiconductor memory device 2100 through the plurality of channels CH1 to CHk.

Figure 17:
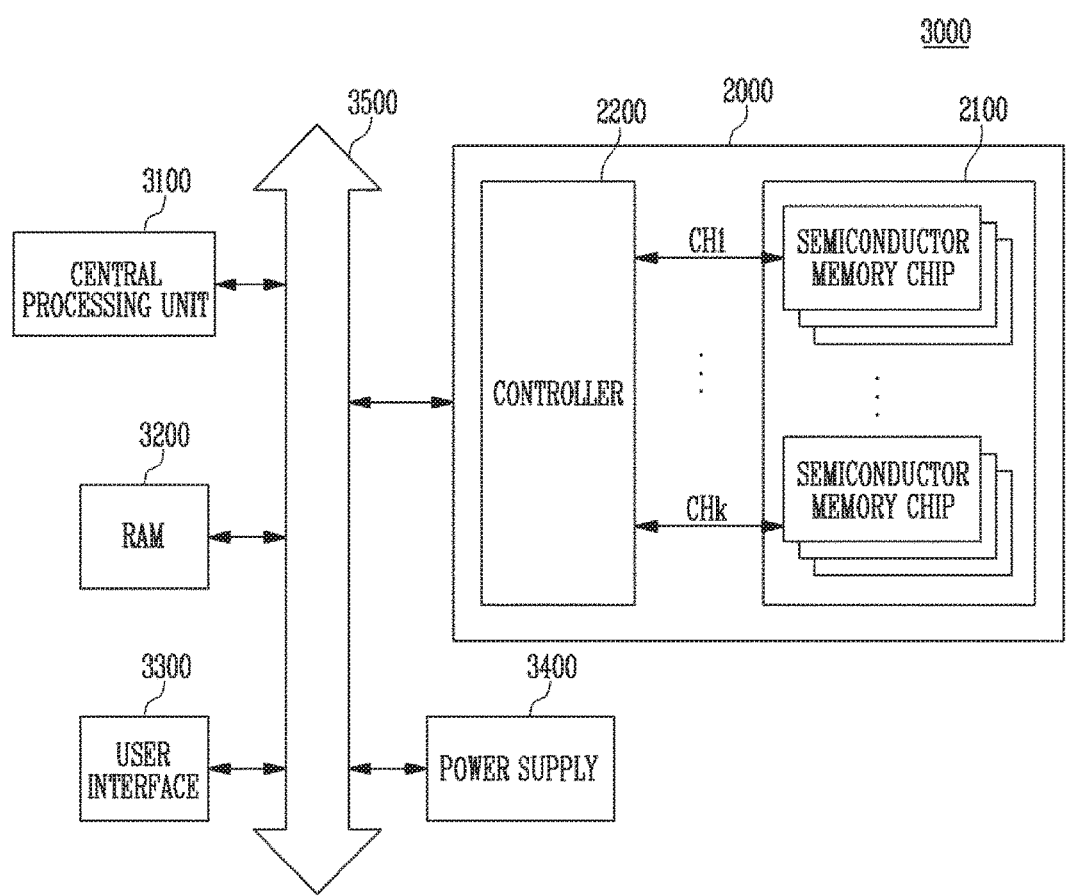
FIG. 17 is a block diagram illustrating a computing system including the storage device described with reference to FIG. 16.

FIG. 17 is a block diagram illustrating a computing system including the storage device described with reference to FIG. 16.

Referring to FIG. 17, the computing system 300 may include a central processing unit 3100, a RAM 3200, a user interface 3300, a power supply 3400, a system bus 3500, and a storage device 2000.

The storage device 2000 is electrically coupled to the central processing unit 3100, the RAM 3200, the user interface 3300, and the power supply 3400 through the system bus 3500. Data supplied through user interface 3300 or data processed by the central processing unit 3100 are stored in the storage device 2000.

FIG. 17 illustrates that the semiconductor memory device 2100 is coupled to the system bus 3500 through the controller 2200. However, the semiconductor memory device 2100 may be directly coupled to the system bus 3500. The function of the controller 2200 may be performed by the central processing unit 3100 and the RAM 3200.

FIG. 17 illustrates that the storage device 2000 described with reference to FIG. 16 is provided. However, the storage device 2000 may be replaced by the storage device including the controller 200 and the semiconductor memory device 100, which are described with reference to FIG. 15.

According to the present disclosure, there can be provided a semiconductor memory device capable of efficiently managing a cache-normal state.

Further, according to the present disclosure, there can be provided a method for operating a semiconductor memory device capable of efficiently managing a cache-normal state.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:
1. A semiconductor memory device comprising:
 a memory cell array including a plurality of memory blocks;
 a page buffer configured to sense data of a selected page of the memory cell array;
 a cache buffer configured to temporarily store the data sensed by the page buffer; and
 a control logic configured to control operations of the page buffer and the cache buffer to read data stored in the memory cell array,
 wherein the control logic controls operations of the page buffer and the cache buffer, based on a cache-normal state of the semiconductor memory device.

2. The semiconductor memory device of claim 1, wherein, when a normal command is received while the cache-normal state of the semiconductor memory device is a cache state, the control logic:
 controls the page buffer and the cache buffer to perform a cache completion operation; and
 controls the page buffer and the cache buffer to perform an operation corresponding to the normal command after the cache completion operation is performed.

3. The semiconductor memory device of claim 2, wherein the control logic switches the cache-normal state of the semiconductor memory device from the cache state to a normal state after the cache completion operation is performed.

4. The semiconductor memory device of claim 1, wherein, when a cache command is received while the cache-normal state of the semiconductor memory device is a normal state, the control logic:
   switches the cache-normal state of the semiconductor memory device from the normal state to the cache state; and
   controls the page buffer and the cache buffer to perform an operation corresponding to the received cache command.

5. The semiconductor memory device of claim 1, wherein the control logic includes a cache state processor configured to manage the cache-normal state of the semiconductor memory device,
   wherein the cache state processor controls the page buffer and the cache buffer to perform the cache completion operation, based on the cache-normal state of the semiconductor memory device and the type of a received command.

6. The semiconductor memory device of claim 5, wherein the cache state processor includes:
   a command storing section configured to store a command received by the semiconductor memory device;
   a cache-normal state storing section configured to store the cache-normal state of the semiconductor memory device; and
   a command operation control section configured to control operations of the page buffer and the cache buffer, based on the command and the cache-normal state.

7. The semiconductor memory device of claim 6, wherein, when the command stored in the command storing section is a normal command, and the cache-normal state stored in the cache-normal state storing section is a cache state,
   the command operation control section controls the page buffer and the cache buffer to perform the cache completion operation before an operation corresponding to the normal command is performed.

8. The semiconductor memory device of claim 7, wherein the command operation control section controls the page buffer and the cache buffer to perform an operation corresponding to the normal command after the cache completion operation is performed.

9. The semiconductor memory device of claim 7, wherein the command operation control section updates the cache-normal state stored in the cache-normal state storing section to a normal state after the cache completion operation is performed.

10. The semiconductor memory device of claim 6, wherein, when the command stored in the command storing section is a cache command, and the cache-normal state stored in the cache-normal state storing section is a normal state,
    the command operation control section updates the cache-normal state stored in the cache-normal state storing section to a cache state, and controls the page buffer and the cache buffer to perform an operation corresponding to the cache command.

11. A method for operating a semiconductor memory device, the method comprising:
    receiving a first command from a controller; and
    controlling operations of a page buffer and a cache buffer, based on a cache-normal state of the semiconductor memory device and the type of the first command.

12. The method of claim 11, wherein, when the first command is a normal command, and the cache-normal state is a cache state,
    the controlling of the operations of the page buffer and the cache buffer, based on the cache-normal state of the semiconductor memory device and the type of the first command, includes:
    performing a cache completion operation; and
    performing an operation corresponding to the first command.

13. The method of claim 11, further comprising updating the cache-normal state from the cache state to a normal state after the cache completion operation is performed.

14. The method of claim 11, wherein, when the first command is a cache command, and the cache-normal state is a normal state,
    the controlling of the operations of the page buffer and the cache buffer, based on the cache-normal state of the semiconductor memory device and the type of the first command, includes:
    performing an operation corresponding to the first command; and
    updating the cache-normal state from the normal state to a cache state.

15. A semiconductor memory device comprising:
    a memory cell array;
    a peripheral circuit configured to perform a read operation on the memory cell array in a state among cache and normal states, and including page and cache buffers configured to sequentially buffer data read out from the memory cell array in a pipelining manner in the cache state; and
    a control logic configured to reset, in response to a read command for reading data in the normal state, the page and cache buffers working in the cache state and then controlling the peripheral circuit to perform the read operation on the memory cell array in the normal state.

16. The semiconductor memory device of claim 15, wherein, when a read command for reading data in the normal state is received while the state of the semiconductor memory device is a cache state, the control logic:
    controls the page buffer and the cache buffer to perform a cache completion operation; and
    controls the page buffer and the cache buffer to perform an operation corresponding to the normal command after the cache completion operation is performed.

17. The semiconductor memory device of claim 15, wherein the control logic includes a cache state processor configured to manage the state, among the cache and normal states, of the semiconductor memory device,
    wherein the cache state processor controls the page buffer and the cache buffer to perform the cache completion operation, based on the state, among the cache and normal states, of the semiconductor memory device and the type of a received command.

18. The semiconductor memory device of claim 17, wherein the cache state processor includes:
    a command storing section configured to store a command received by the semiconductor memory device;
    a cache-normal state storing section configured to store the state, among the cache and normal states, of the semiconductor memory device; and
    a command operation control section configured to control operations of the page buffer and the cache buffer, based on the command and the state.

19. The semiconductor memory device of claim 18, wherein, when the command stored in the command storing section is a normal command, and the state, among the cache and normal states, stored in the cache-normal state storing section is a cache state, the command operation control section controls the page buffer and the cache buffer to perform the cache completion operation before an operation corresponding to the normal command is performed.

20. The semiconductor memory device of claim 19, wherein the command operation control section controls the page buffer and the cache buffer to perform an operation corresponding to the normal command after the cache completion operation is performed.

* * * * *